US012628641B2

(12) United States Patent
Choi et al.

(10) Patent No.: US 12,628,641 B2
(45) Date of Patent: May 12, 2026

(54) MEMORY DEVICE AND MANUFACTURING METHOD OF THE MEMORY DEVICE

(71) Applicant: SK hynix Inc., Icheon-si (KR)

(72) Inventors: Won Geun Choi, Icheon-si (KR); Jeong Hwan Kim, Icheon-si (KR); Mi Seong Park, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 584 days.

(21) Appl. No.: 18/095,922

(22) Filed: Jan. 11, 2023

(65) Prior Publication Data

US 2023/0395495 A1 Dec. 7, 2023

(30) Foreign Application Priority Data

Jun. 2, 2022 (KR) ........................ 10-2022-0067784

(51) Int. Cl.
| | |
|---|---|
| *H01L 23/528* | (2006.01) |
| *H10B 41/10* | (2023.01) |
| *H10B 41/27* | (2023.01) |
| *H10B 43/10* | (2023.01) |
| *H10B 43/27* | (2023.01) |

(52) U.S. Cl.
CPC ......... *H01L 23/5283* (2013.01); *H10B 41/10* (2023.02); *H10B 41/27* (2023.02); *H10B 43/10* (2023.02); *H10B 43/27* (2023.02)

(58) Field of Classification Search
CPC ..... H01L 23/5283; H10B 41/10; H10B 41/27; H10B 43/10; H10B 43/27; H10B 43/35; H10B 43/30; H10B 43/50
See application file for complete search history.

(56) References Cited

U.S. PATENT DOCUMENTS

| | | | | |
|---|---|---|---|---|
| 8,748,971 | B2 | 6/2014 | Tanaka et al. | |
| 11,069,708 | B2 * | 7/2021 | Jiang | H10B 43/27 |
| 12,402,310 | B2 * | 8/2025 | Park | H01L 23/481 |
| 2017/0077108 | A1 | 3/2017 | Kawaguchi et al. | |
| 2018/0277554 | A1 | 9/2018 | Kaneko | |
| 2019/0341396 | A1 * | 11/2019 | You | H10D 30/68 |
| 2020/0343307 | A1 * | 10/2020 | Lee | H10B 63/84 |
| 2022/0068955 | A1 * | 3/2022 | King | H10B 43/10 |
| 2022/0149053 | A1 * | 5/2022 | Lee | H10B 43/27 |
| 2022/0344366 | A1 * | 10/2022 | Park | H10B 41/27 |
| 2024/0365546 | A1 * | 10/2024 | Gandhi | H10B 43/35 |

FOREIGN PATENT DOCUMENTS

| | | |
|---|---|---|
| CN | 107293549 A | 10/2017 |
| CN | 108231781 A | 6/2018 |
| CN | 109801922 A | 5/2019 |
| CN | 112242402 A | 1/2021 |

(Continued)

*Primary Examiner* — Jarrett J Stark

(74) *Attorney, Agent, or Firm* — WILLIAM PARK AND ASSOCIATES LTD.

(57) ABSTRACT

There are provided a memory device and a manufacturing method of the memory device. The memory device includes: a stack structure including gate lines stacked to be spaced apart from each other; main plugs arranged to be spaced apart from each other; plug isolation patterns isolating the main plugs into first and second sub-plugs; and a select isolation pattern isolating at least one gate line located between the plug isolation patterns adjacent to each other.

14 Claims, 35 Drawing Sheets

(56) References Cited

FOREIGN PATENT DOCUMENTS

| JP | 2020155691 A | 9/2020 |
| KR | 1020160008404 A | 1/2016 |
| KR | 1020160016430 A | 2/2016 |
| KR | 1020180073161 A | 7/2018 |
| KR | 1020200044215 A | 4/2020 |
| KR | 1020200125148 A | 11/2020 |
| KR | 1020210010210 A | 1/2021 |
| KR | 1020210099348 A | 8/2021 |

* cited by examiner

MEMORY DEVICE AND MANUFACTURING METHOD OF THE MEMORY DEVICE

CROSS-REFERENCE TO RELATED APPLICATION

The present application claims priority under 35 U.S.C. § 119(a) to Korean patent application number 10-2022-0067784 filed on Jun. 2, 2022, in the Korean Intellectual Property Office, the entire disclosure of which is incorporated by reference herein.

BACKGROUND

1. Technical Field

The present disclosure generally relates to a memory device and a manufacturing method of the memory device, and more particularly, to a three-dimensional memory device and a manufacturing method of the three-dimensional memory device.

2. Related Art

A memory device may be classified into a volatile memory device in which stored data disappears when the supply of power is interrupted and a nonvolatile memory device in which stored data is retained even when the supply of power is interrupted.

The nonvolatile memory device may include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

A NAND flash memory system may include a memory device configured to store data and a controller configured to control the memory device. The memory device may include a memory cell array in which data is stored and peripheral circuits configured to perform a program, read or erase operation in response to a command transmitted from the controller.

The memory cell array may include a plurality of memory blocks, and each of the plurality of memory blocks may include a plurality of memory cells.

As the degree of integration of memory devices increases, a memory device capable of storing large-capacity data is required, and simplification of manufacturing processes is required to reduce manufacturing cost.

SUMMARY

In accordance with an aspect of the present disclosure, there is provided a memory device including: a stack structure including gate lines stacked to be spaced apart from each other; main plugs arranged to be spaced apart from each other; plug isolation patterns isolating the main plugs into first and second sub-plugs; and a select isolation pattern isolating at least one gate line located between the plug isolation patterns adjacent to each other.

In accordance with another aspect of the present disclosure, there is provided a method of manufacturing a memory device, the method including: forming, a lower structure, a stack structure including gate lines, main plugs arranged in a vertical direction, and plug isolation patterns isolating the main plugs into first and second sub-plugs; forming a second isolation hole isolating at least one gate line, the second isolation hole formed between the plug isolation patterns; and forming a select isolation pattern inside the second isolation hole.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 3 is a diagram illustrating a structure of the memory cell array.

FIG. 4 is a view illustrating a layout of a memory device in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein. It will be understood that although the terms first, second, third etc. may be used herein to describe various elements, these elements should not be limited by these terms. These terms are only used to distinguish one element from another element, but not used to define only the element itself or to mean a particular sequence.

Various embodiments provide a memory device and a manufacturing method of the memory device, which can improve the degree of integration of the memory device.

Figure 1:
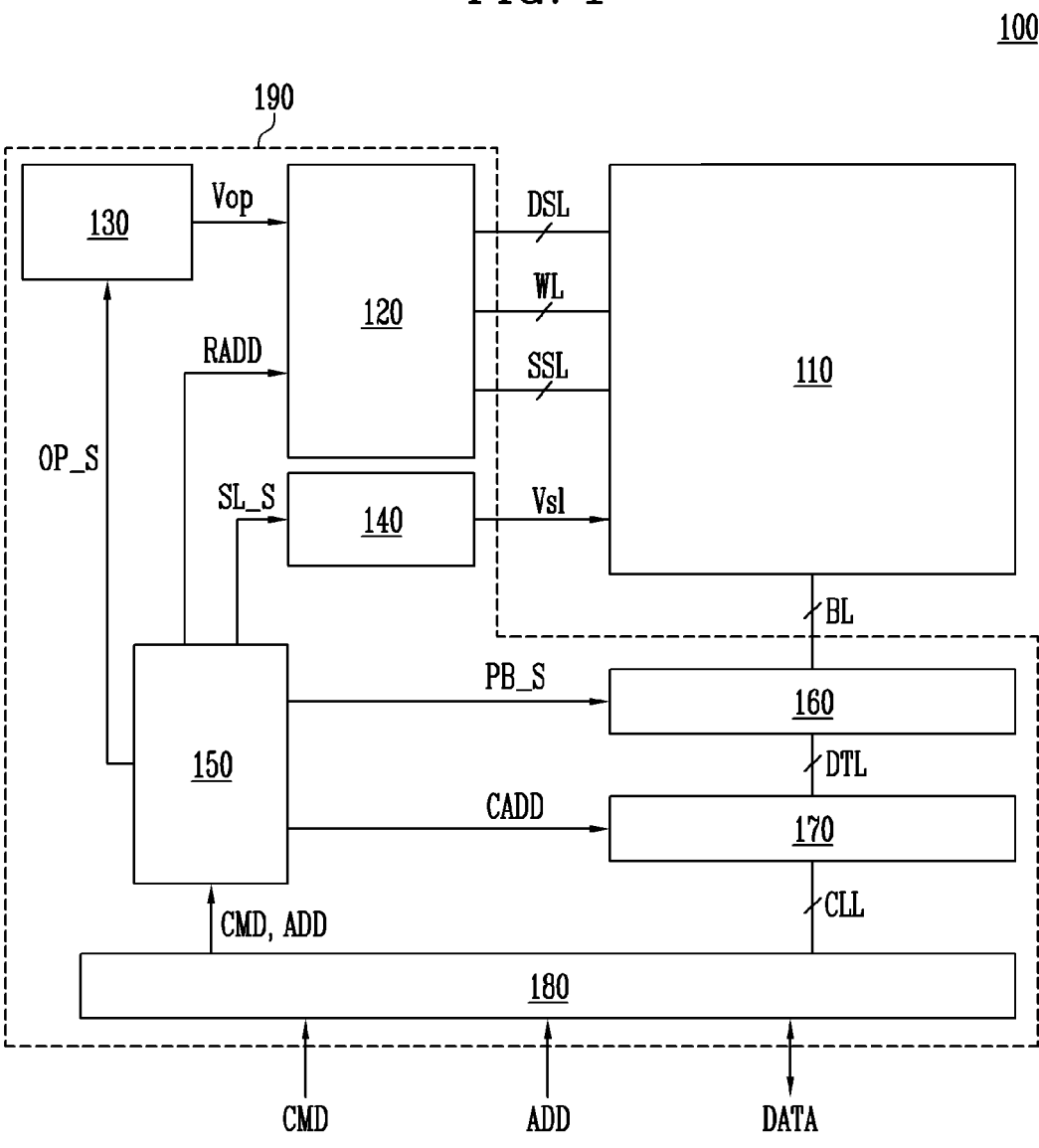
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 100 may include a peripheral circuit 190 and a memory cell array 110.

The peripheral circuit 190 may be configured to perform a program operation and a verify operation, which are used to store data, to perform a read operation for outputting data stored in the memory cell array 110, or to perform an erase operation for erasing data stored in the memory cell array 110. The peripheral circuit 190 may include a voltage generating circuit 130, a row decoder 120, a source line driver 140, a control circuit 150, a page buffer 160, a column decoder 170, and an input/output circuit 180.

The memory cell array 110 may include a plurality of memory cells in which data is stored. In an embodiment, the memory cell array 110 may include a three-dimensional memory cell array. The plurality of memory cells may store single-bit data or multi-bit data of two or more bits according to a program manner. The plurality of memory cells may constitute a plurality of strings. Memory cells included in each of the strings may be electrically connected to each other through a channel. Channels included in the strings may be connected to the page buffer 160 through bit lines BL.

The voltage generating circuit 130 may generate various operating voltages Vop used for a program operation, a read operation, or an erase operation in response to an operation signal OP_S. For example, the voltage generating circuit 130 may selectively generate and output the operating voltages Vop including a program voltage, a verify voltage, a pass voltage, a read voltage, an erase voltage, and the like.

The row decoder 120 may be connected to the memory cell array 110 through a plurality of drain select lines DSL, a plurality of word lines WL, and a plurality of source select lines SSL. The row decoder 120 may transfer the operating voltages Vop to the plurality of drain select lines DSL, the plurality of word lines WL, and the plurality of source select lines SSL in response to a row address RADD.

The source line driver 140 may transmit a source voltage Vsl to the memory cell array 110 in response to a source line control signal SL_S. For example, the source voltage Vsl may be transferred to a source line connected to the memory cell array 110.

The control circuit 150 may output the operation signal OP_S, the row address RADD, the source line control signal SL_S, a page buffer control signal PB_S, and a column address CADD, in response to a command CMD and an address ADD.

The page buffer 160 may be connected to the memory cell array 110 through the bit lines BL. The page buffer 160 may store data DATA received through a plurality of bit lines BL in response to the page buffer control signal PB_S. The page buffer 160 may sense a voltage or current of the plurality of bit lines BL in a read operation.

The column decoder 170 may transmit data DATA input from the input/output circuit 180 to the page buffer 160 or transmit data DATA stored in the page buffer 160 to the input/output circuit 180, in response to the column address CADD. The column decoder 170 may exchange data DATA with the input/output circuit 180 through column lines CLL, and exchange data DATA with the page buffer 160 through data lines DTL.

The input/output circuit 180 may transfer, to the control circuit 150, a command CMD and an address ADD, which are transferred from an external device (e.g., a controller) connected to the memory device 100, and output data received from the column decoder 170 to the external device.

Figure 2:
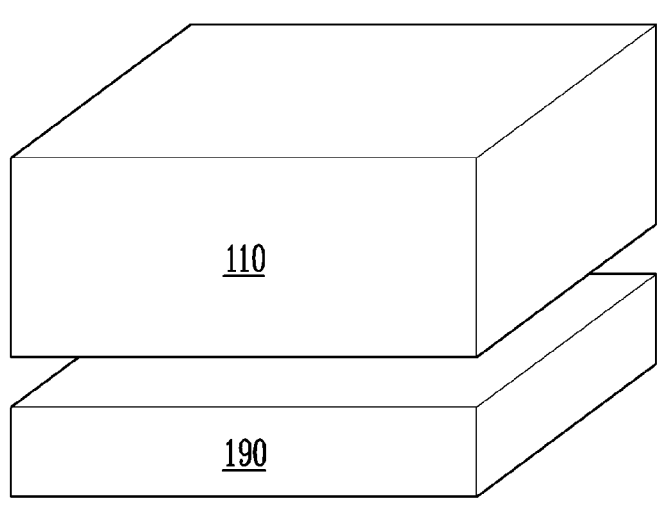
FIG. 2 is a diagram illustrating an arrangement structure of a memory cell array and a peripheral circuit.
Figure 2:
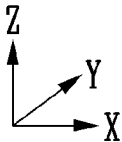

FIG. 2 is a diagram illustrating an arrangement structure of the memory cell array and the peripheral circuit.

Referring to FIG. 2, the memory cell array 110 may be stacked above the peripheral circuit 190. For example, when a substrate forms an X-Y plane, the peripheral circuit 190 may be stacked in a Z-axis direction from the substrate, and the memory cell array 110 may be stacked above the peripheral circuit 190.

Figure 3:
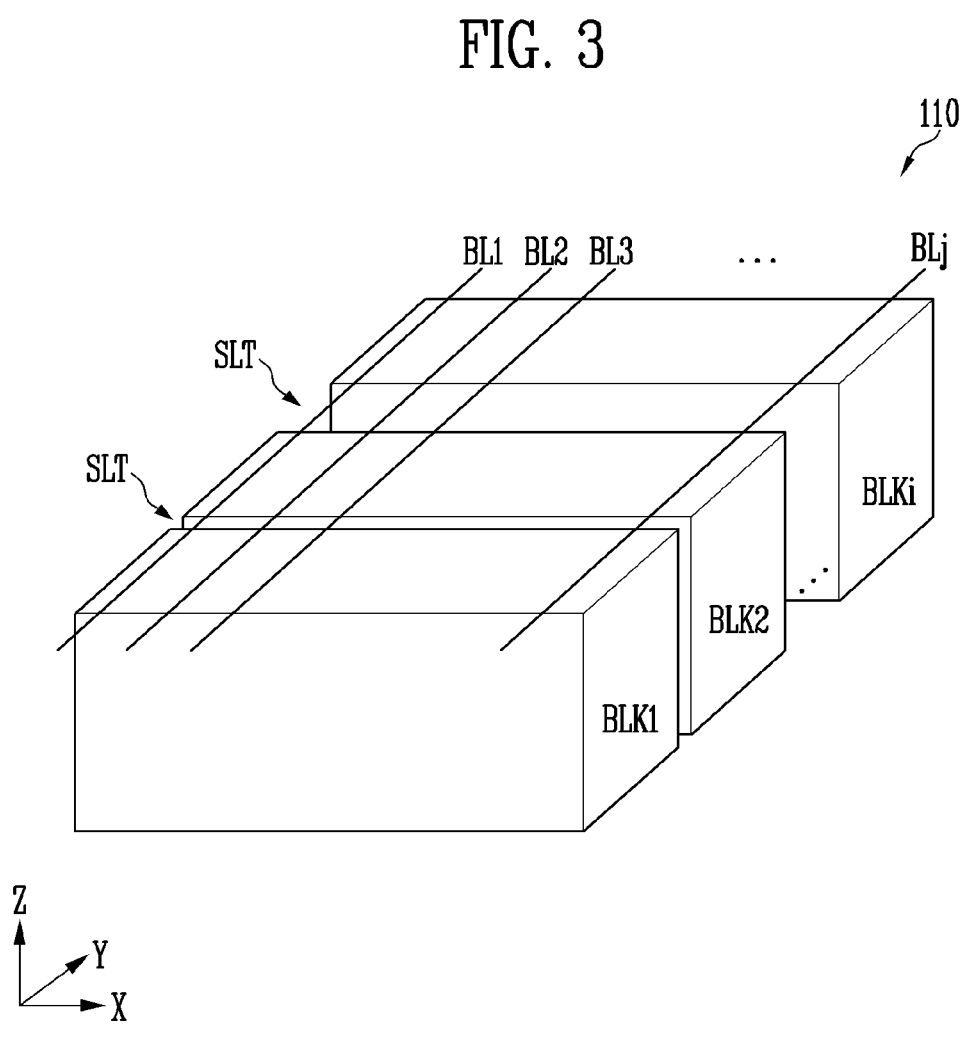

FIG. 3 is a diagram illustrating a structure of the memory cell array.

Referring to FIG. 3, the memory cell array 110 may include first to ith memory blocks BLK1 to BLKi (—i—is a positive integer). The first to ith memory blocks BLK1 to BLKi may be arranged to be spaced apart from each other along a Y-axis direction, and be commonly connected to first to ith bit lines BL1 to BLi. For example, the first to ith bit lines BL1 to BLi may extend along the Y-axis direction, and be disposed to be spaced apart from each other along an X-axis direction. The first to ith memory blocks BLK1 to BLKi may be isolated from each other by a slit SLT.

Figure 4:
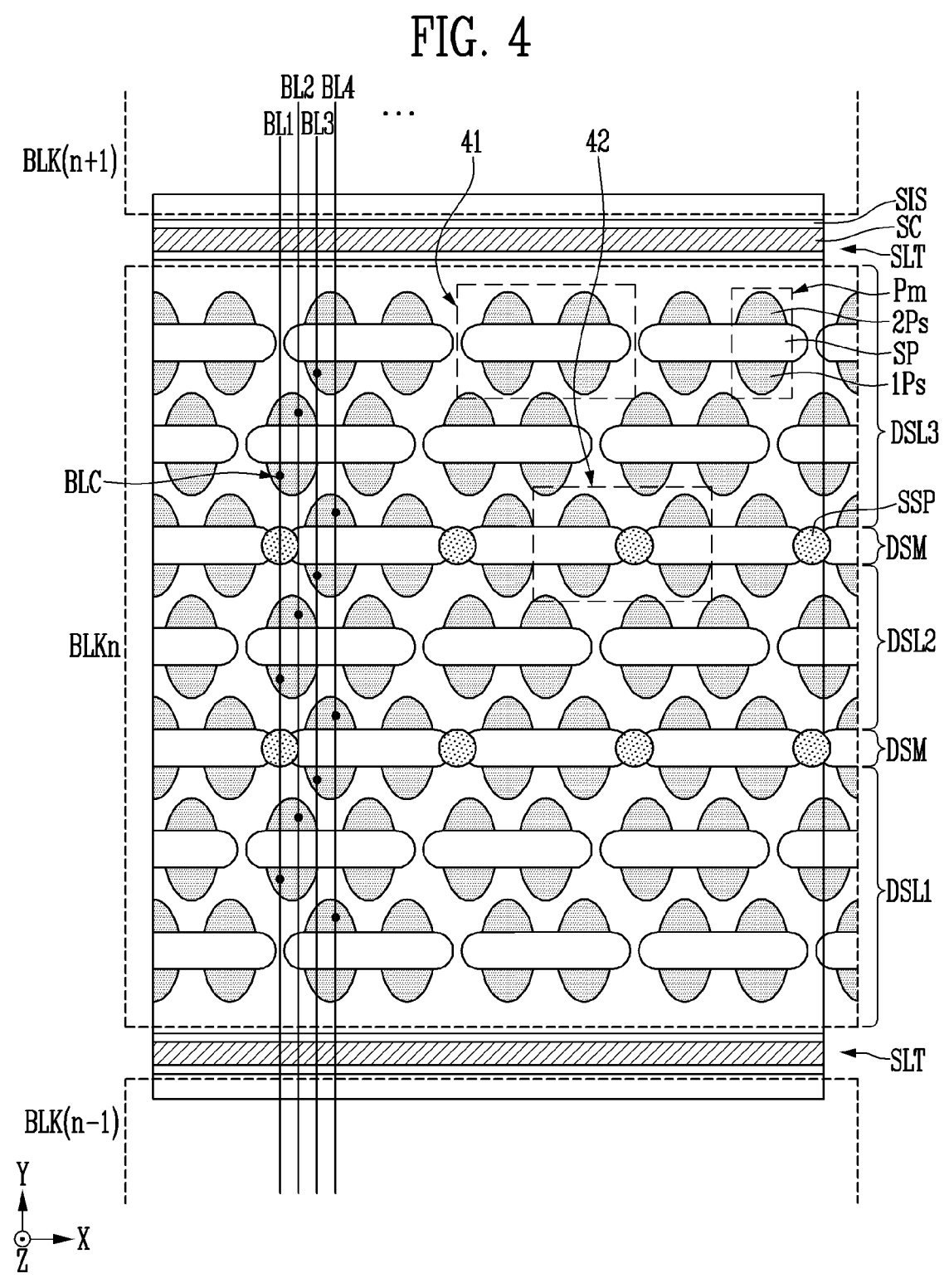

FIG. 4 is a view illustrating a layout of a memory device in accordance with an embodiment of the present disclosure.

Referring to FIG. 4, an (n−1)th memory block BLK(n−1), an nth memory block BLKn, and an (n+1)th memory block BLK(n+1), which are included in the memory block, may be disposed to be spaced apart from each other in the Y-axis direction. The (n−1)th memory block BLK(n−1), the nth memory block BLKn, and the (n+1)th memory block BLK (n+1) may be configured identically to one another, and be distinguished from each other by slits SLT. Each of the slits SLT may include a slit insulating layer SIS and a source contact SC. The slit insulating layer SIS may electrically block memory blocks from each other. The source contact SC may be in contact with a source line (not shown) formed under the memory blocks, and transfer a source line voltage generated in a voltage generating circuit to the source line.

The (n−1)th memory block BLK(n−1), the nth memory block BLKn, and the (n+1)th memory block BLK(n+1) may be configured identically to one another, and therefore, the nth memory block BLKn among the (n−1)th memory block BLK(n−1), the nth memory block BLKn, and the (n+1)th memory block BLK(n+1) will be described below as an example.

The nth memory block BLKn may include a plurality of main plugs Pm. The main plug Pm may include first and second sub-plugs 1Ps and 2Ps isolated from each other by a plug isolation pattern SP, and each of the first and second sub-plugs 1Ps and 2Ps may include a plurality of memory cells. Although a structure in which two main plugs Pm are isolated into first and second sub-plugs 1Ps and 2Ps by one plug isolation pattern SP is illustrated in FIG. 4, the number of main plugs Pm isolated by one plug isolation pattern SP is not limited to that shown in the drawing. For example, one main plug Pm may be isolated into first and second sub-plugs 1Ps and 2Ps by one plug isolation pattern SP, and each of three main plugs Pm may be isolated into first and second sub-plugs 1Ps and 2Ps by one plug isolation pattern SP. In the following embodiment, a structure in which each of two main plugs Pm is isolated into first and second sub-plugs 1Ps and 2Ps by one plug isolation pattern SP is described.

Since different bit lines BL are connected to the first and second sub-plugs 1Ps and 2Ps, memory cells included in the first and second sub-plugs 1Ps and 2Ps may constitute different strings. For example, the first sub-plug 1Ps may be connected to a first bit line BL1 through a bit line contact BLC, and the second sub-plug 2Ps may be connected to a second bit line BL2 through a bit line contact BLC.

The nth memory block BLKn may include source select lines (not shown), word lines (not shown), and drain select lines DSL1 to DSL3, which are stacked. For example, the word lines may be formed above the source select lines, and the drain select lines DSL1 to DSL3 may be formed above the word lines.

The nth memory block BLKn may include at least one drain isolation mask DSM. The drain isolation mask DSM may be a structure for isolating the drain select lines DSL1 to DSL3 from each other. The drain isolation mask DSM may include a plurality of plug isolation patterns SP and a plurality of select isolation patterns SSP. Therefore, drain select lines DSL1 to DSL3 formed in the same level among gate lines included in a memory block may be isolated into a plurality of drain select lines by the drain isolation mask DSM configured with the plug isolation patterns SP and the select isolation patterns SSP. In an embodiment, drain select lines DSL1 to DSL3 formed in the same layer among gate lines included in a memory block may be isolated into a plurality of drain select lines by the drain isolation mask DSM configured with the plug isolation patterns SP and the select isolation patterns SSP. For example, as shown in FIG. 4, the drain select lines may be isolated into first to third drain select lines DSL1 to DSL3 by the drain isolation mask DSM. When a plurality of drain select lines are stacked, each of the plurality of drain select lines may be isolated into first to third drain select lines DSL1 to DSL3. Different voltages may be applied to the first to third drain select lines DSL1 to DSL3 isolated from each other.

Referring to the layout shown in FIG. 4, select isolation patterns SSP may partially overlap with plug isolation patterns SP to form the drain isolation mask DSM. The plug isolation patterns SP may be formed to be spaced apart from each other in the X-axis direction. The select isolation patterns SSP may be formed between the plug isolation patterns SP. For example, the select isolation patterns SSP may be formed between plug isolation patterns SP adjacent to each other. The shape of the select isolation patterns SSP is not limited to that shown in the drawing. For example, the select isolation patterns SSP may be formed in an elliptical, circular or quadrangular shape.

A plug region 41 in which memory cells are included and a select isolation pattern region 42 in which a select isolation pattern SSP and a plug isolation pattern SP are included will be described in detail as follows.

Figure 5:
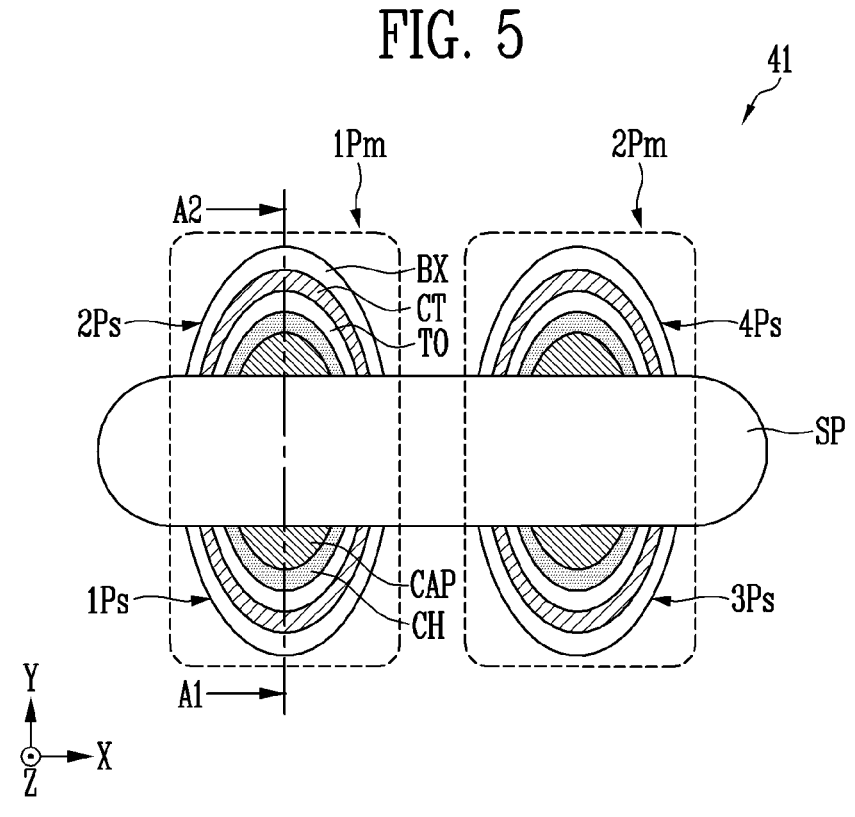
FIG. 5 is a layout illustrating a structure of a plug region in accordance with an embodiment of the present disclosure.

FIG. 5 is a layout illustrating a structure of a plug region 41 in accordance with an embodiment of the present disclosure.

Referring to FIG. 5, first and second main plugs 1Pm and 2Pm and a plug isolation pattern SP are shown. The first and second main plugs 1Pm and 2Pm may be arranged to be spaced apart from each other along the X-axis direction, and each of the first and second main plugs 1Pm and 2Pm may be configured to extend along the Y-axis direction. The plug isolation pattern SP may extend along the X-axis direction to isolate the first main plugs 1Pm and isolate the second main plugs 2Pm in the Y-axis direction. Plug isolation patterns SP along with a select isolation pattern SSP may be formed of an insulating material to isolate gate lines GL from each other. For example, the plug isolation patterns SP may be formed of an oxide layer or a silicon oxide layer.

The first main plug 1Pm may include first and second sub-plugs 1Ps and 2Ps isolated from each other by the plug isolation pattern SP, and the second main plug 2Pm may include third and fourth sub-plugs 3Ps and 4Ps isolated from each other by the plug isolation pattern SP. The third sub-plug 3Ps may be formed in the same structure as the first sub-plug 1Ps, and the fourth sub-plug 4Ps may be formed in the same structure as the second sub-plug 2Ps. The structure of the first sub-plug 1Ps may be symmetrical to the structure of the second sub-plug 2Ps with respect to the plug isolation pattern SP, and the structure of the third sub-plug 3Ps may be symmetrical to the structure of the fourth sub-plug 4Ps with respect to the plug isolation pattern SP.

Since the first to fourth sub-plugs 1Ps to 4Ps are configured similarly to one another, the structure of the first sub-plug 1Ps among the first to fourth sub-plugs 1Ps to 4Ps will be described below as an example.

The first sub-plug 1Ps may include a capping layer CAP, a channel layer CH, a tunnel insulating layer TO, a charge trap layer CT, and a blocking layer BX. The capping layer CAP may be formed at a top end of the first sub-plug 1Ps formed in a vertical direction from a substrate, and be used, in some embodiments, to improve an electrical characteristic of drain select transistors. For example, the capping layer CAP may be formed of a conductive material. For example, the capping layer CAP may be formed of a doped poly-silicon layer. Although not shown in FIG. 5, a core pillar may be formed on the bottom of the capping layer CAP. For example, the core pillar may be formed of an insulating material or a conductive material. The channel layer CH may be formed to surround the capping layer CAP and the core pillar, and be formed of a conductive material. For example, the channel layer CH may be formed of a poly-silicon layer. The tunnel insulating layer TO may be formed to surround the channel layer CH, and be formed of an insulating material. For example, the tunnel insulating layer TO may be formed of an oxide layer or a silicon oxide layer. The charge trap layer CT may be formed to surround the tunnel insulating layer TO, and be formed of a material capable of trapping electrons. For example, the charge trap layer CT may be formed of a nitride layer. The blocking layer BX may be formed to surround the charge trap layer CT, and be formed of an insulating material. For example, the blocking layer BX may be formed of an oxide layer or a silicon oxide layer. Although not shown in the drawing, the first to fourth sub-plugs 1Ps to 4Ps may be electrically connected to different bit lines through different bit line contacts. For example, the channel layer CH of the first sub-plug 1Ps may be connected to a first bit line through a bit line contact, a channel layer CH of the second sub-plug 2Ps may be connected to a second bit line through a bit line contact, a channel layer CH of the third sub-plug 3Ps may be connected to a third bit line through a bit line contact, and a channel layer CH of the fourth sub-plug 4Ps may be connected to a fourth bit line through a bit line contact.

The structures of the first and second sub-plugs 1Ps and 2Ps will be described in detail with reference to FIG. 6.

Figure 6:
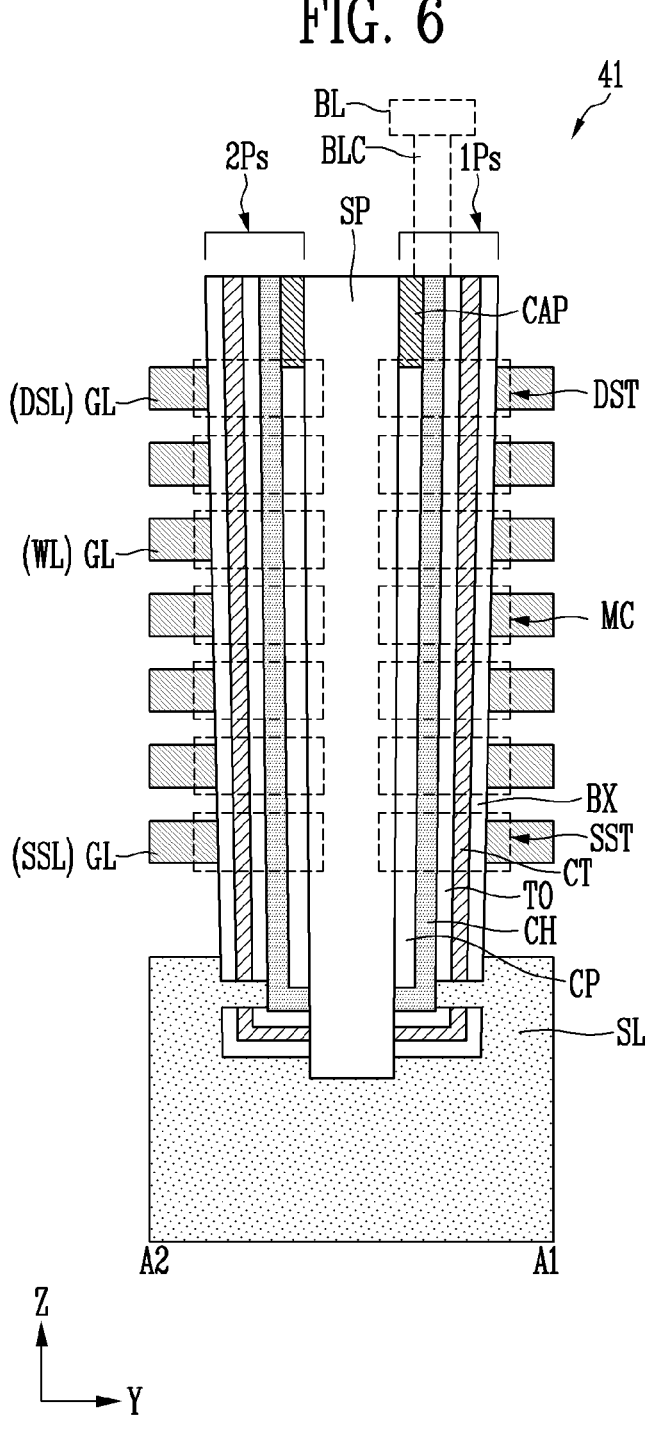
FIG. 6 is a sectional view illustrating a structure of the plug region in accordance with an embodiment of the present disclosure.

FIG. 6 is a sectional view illustrating a structure of the plug region (41 shown in FIG. 5) in accordance with an embodiment of the present disclosure.

In FIG. 6, a section obtained by cutting the first and second sub-plugs 1Ps and 2Ps shown in FIG. 5 in a direction A1-A2 is shown.

The first and second sub-plugs 1Ps and 2Ps and the plug isolation pattern SP may be formed in the vertical direction on a source line SL. The plug isolation pattern SP is formed while penetrating a capping layer CAP, a core pillar CP, a channel layer CH, a tunnel insulating layer TO, a charge trap layer CT, and a blocking layer BX, which are included in a main plug Pm. A bottom surface of the plug isolation pattern SP may be in contact with the source line SL. The main plug Pm may be isolated into the first and second sub-plugs 1Ps and 2Ps by the plug isolation pattern SP.

Gate lines GL may surround the first and second sub-plugs 1Ps and 2Ps and the plug isolation pattern SP, and be disposed to be spaced apart from each other in the Z-axis direction. A lower portion of the channel layer CH may be in contact with the source line SL, and an upper portion of the channel layer CH may be in contact with a bit line contact BLC.

At least one line formed at a lower portion among the gate lines GL may be used as a source select line SSL, and at least one line formed at an upper portion among the gate lines GL may be used as drain select lines DSL. The source select line SSL may be connected to a gate of a source select transistor SST, and the drain select line DSL may be connected to a gate of a drain select transistor DST. The source select transistor SST may be configured to electrically connect or block the source line SL and a channel layer CH in a string to or from each other, or the drain select transistor DST may be configured to electrically connect or block a bit line and the channel layer CH in the string to or from each other. At least one line formed between the source select line SSL and the drain select line DSL among the gate lines GL may be used as a word line WL. The word line WL may be connected to a gate of a memory cell MC.

The bit line contact BLC may be formed on the channel layer CH of the first sub-plug 1Ps, and a bit line BL may be formed on the top of the bit line contact BLC.

Figure 7:
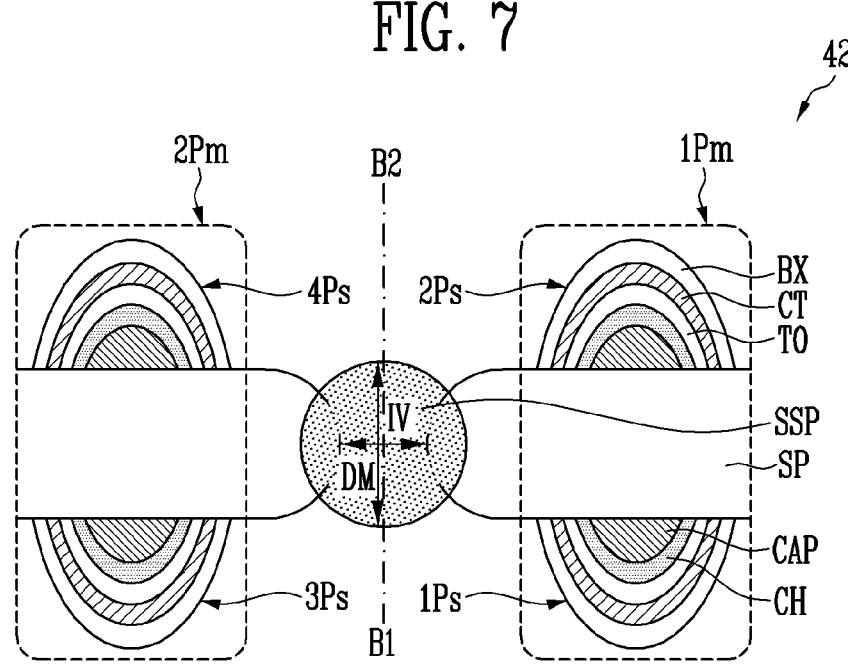
FIG. 7 is a layout illustrating a structure of a select isolation pattern region in accordance with an embodiment of the present disclosure.

FIG. 7 is a layout illustrating a structure of a select isolation pattern region 42 in accordance with an embodiment of the present disclosure.

Referring to FIG. 7, plug isolation patterns SP isolating each of the first and second main plugs 1Pm and 2Pm and a select isolation pattern SSP may be included in the select isolation pattern region 42.

The select isolation pattern SSP may be formed between the plug isolation patterns SP. For example, the plug isolation patterns SP may be symmetrical to each other in the Y-axis direction with respect to the select isolation pattern SSP. The select isolation pattern SSP is formed while penetrating portions of the plug isolation patterns SP, and therefore, partial regions of the select isolation pattern SSP may overlap with the plug isolation patterns SP. The select isolation pattern SSP contacts with the plug isolation patterns SP adjacent to each other. In an embodiment, one of the plug isolation patterns SP is disposed between the first sub-plug 1Ps and the second sub-plug 2Ps and between the third sub-plug 3Ps and the fourth sub-plug 4Ps. In an embodiment, the select isolation pattern SSP is disposed between the plug isolation patterns SP adjacent to each other.

The select isolation pattern SSP may be formed in a circular, elliptical or quadrangular shape. In addition, the select isolation pattern SSP may be formed in various shapes. A diameter DM of the select isolation pattern SSP may be greater than a distance IV between the plug isolation patterns SP adjacent to each other, and be formed not to be in contact with the first and second main plugs 1Pm and 2Pm. The structure of the select isolation pattern SSP will be described in more detail below with reference to a section obtained by cutting the select isolation pattern SSP in a direction B1-B2.

Figure 8:
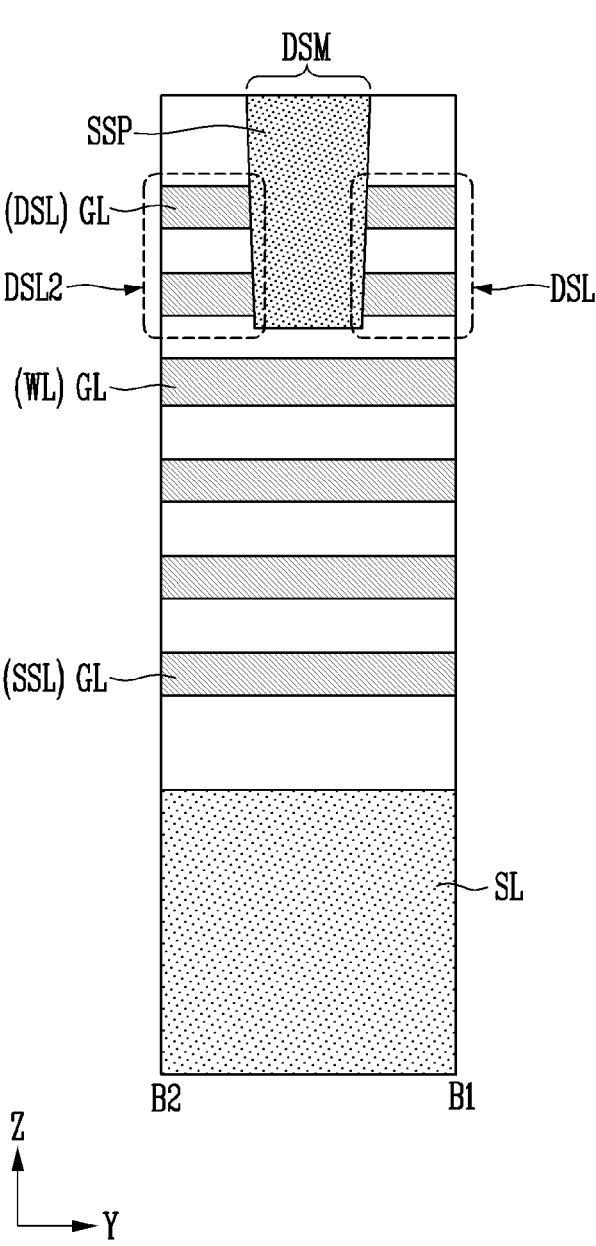
FIG. 8 is a sectional view illustrating a structure of the select isolation pattern region in accordance with an embodiment of the present disclosure.

FIG. 8 is a sectional view illustrating a structure of the select isolation pattern region (42 shown in FIG. 7) in accordance with an embodiment of the present disclosure.

FIG. 8 illustrates a section obtained by cutting the select isolation pattern SSP shown in FIG. 7 in the direction B1-B2.

Referring to FIG. 8, the nth memory block BLKn may include a source line SL, gate lines GL, and a select isolation pattern SSP. The select isolation pattern SSP may be formed in a shape vertically penetrating the gate lines GL. The gate lines GL may include a source select line SSL, a word line WL, and a drain select line DSL. The select isolation pattern SSP may isolate some lines among gate lines GL formed in the same level from each other. For example, the select isolation pattern SSP may isolate the drain select line DSL into a first drain select line DSL1 and a second drain select line DSL2. That is, the drain select line DSL may be isolated into the first and second drain select lines DSL1 and DSL2 along the X-axis direction by the select isolation pattern SSP. The drain isolation mask DSM may be a structure for isolating drain select lines DSL from each other. In an embodiment, the select isolation pattern SSP isolates at least one gate line GL into a first drain select line DSL1 and a second drain select line DSL2 formed in the same layer. In an embodiment the select isolation pattern SSP may be located between the plug isolation patterns SP adjacent to each other as shown in, for example, FIGS. 4 and 7. In an embodiment the select isolation pattern SSP penetrates at least a portion of the plug isolation patterns SP adjacent to each other as shown, for example, in FIGS. 4, 7 and FIGS. 9A to 9J are layouts illustrating a manufacturing method of a memory device in accordance with an embodiment of the present disclosure. FIGS. 10A to 10J are sectional views in a y-axis direction, illustrating a manufacturing method of a memory device in accordance with an embodiment of the present disclosure. FIGS. 11A to 11J are sectional views in an x-axis direction, illustrating a manufacturing method of a memory device in accordance with an embodiment of the present disclosure.

FIGS. 10A to 10J illustrate sectional structures of surfaces cut in a direction D1-D2 shown in FIGS. 9A to 9J, and FIGS. 11A to 11J illustrate sectional structures of surfaces cut in a direction E1-E2 shown in FIGS. 9A to 9J.

Figure 9A:
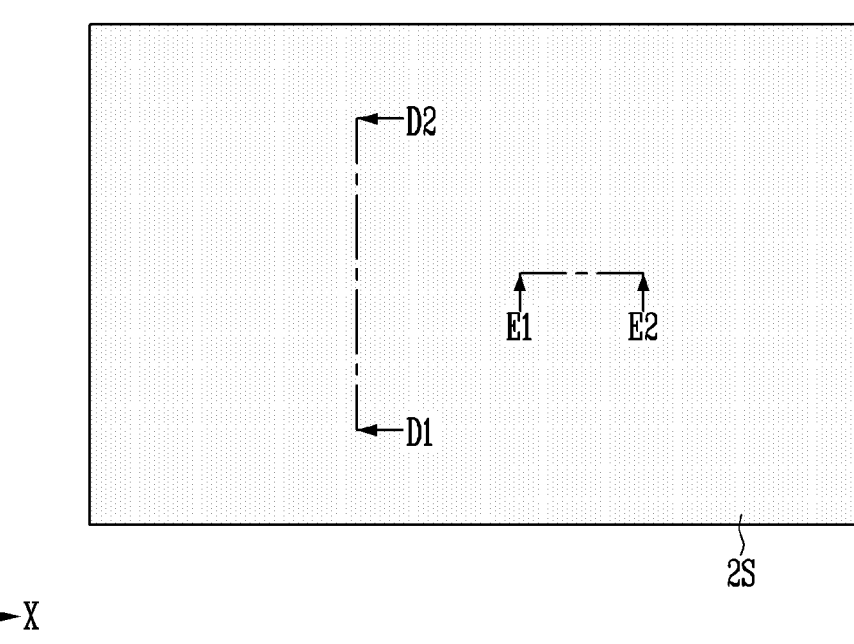
FIGS. 9A, 9B, 9C, 9D, 9E, 9F, 9G, 9H, 9I, and 9J are layouts illustrating a manufacturing method of a memory device in accordance with an embodiment of the present disclosure.
Figure 9B:
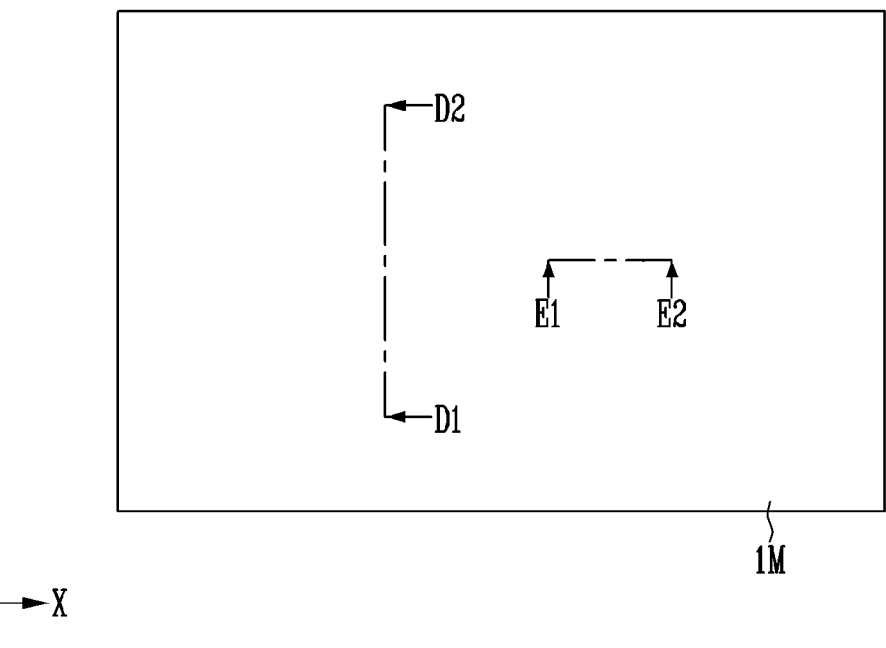
Figure 10A:
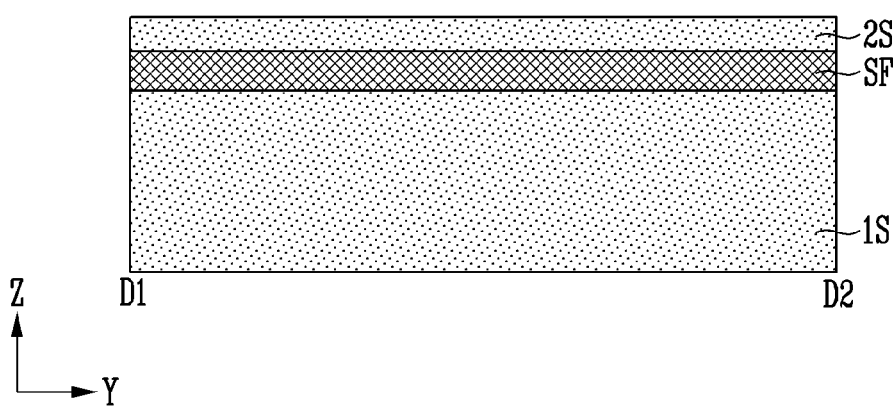
FIGS. 10A, 10B, 10C, 10D, 10E, 10F, 10G, 10H, 10I, and 10J are sectional views in a y-axis direction, illustrating a manufacturing method of a memory device in accordance with an embodiment of the present disclosure.
Figure 10B:
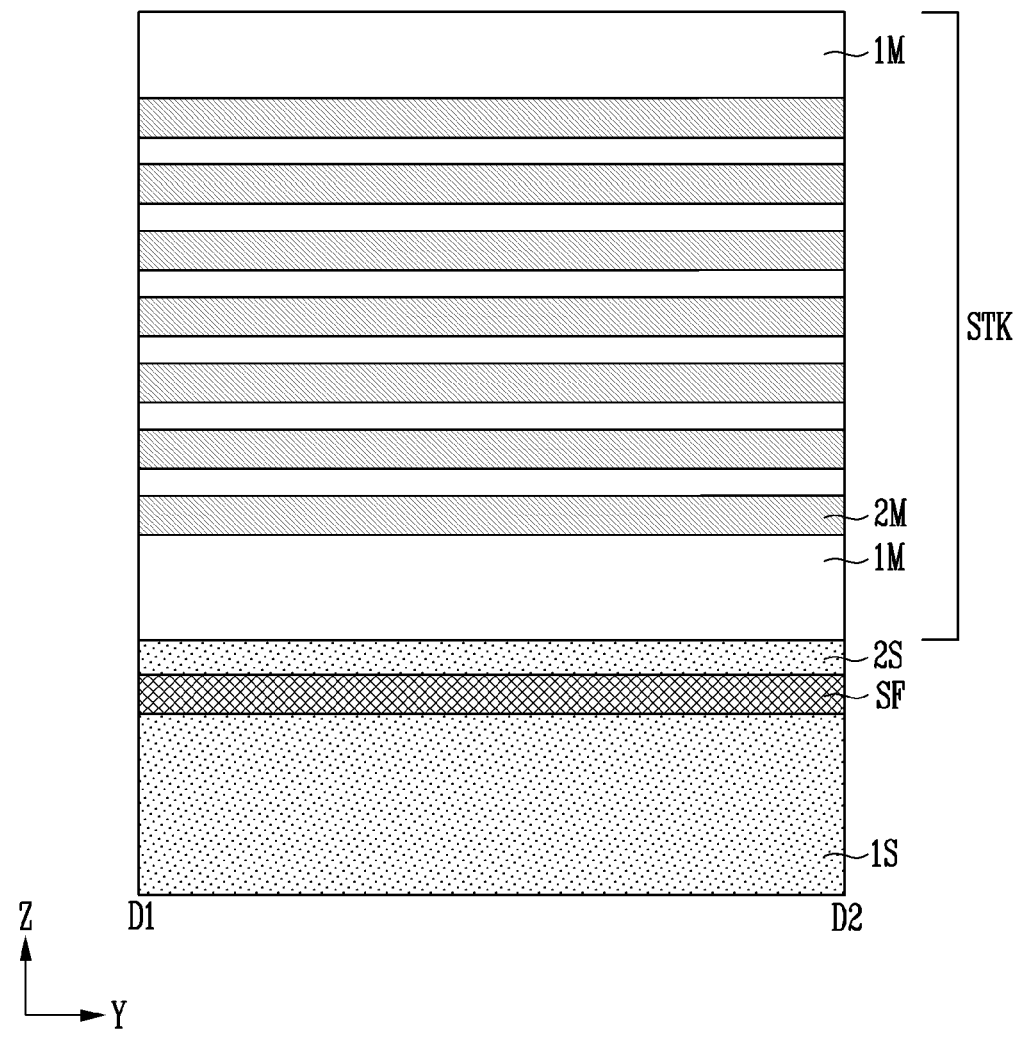
Figure 11A:
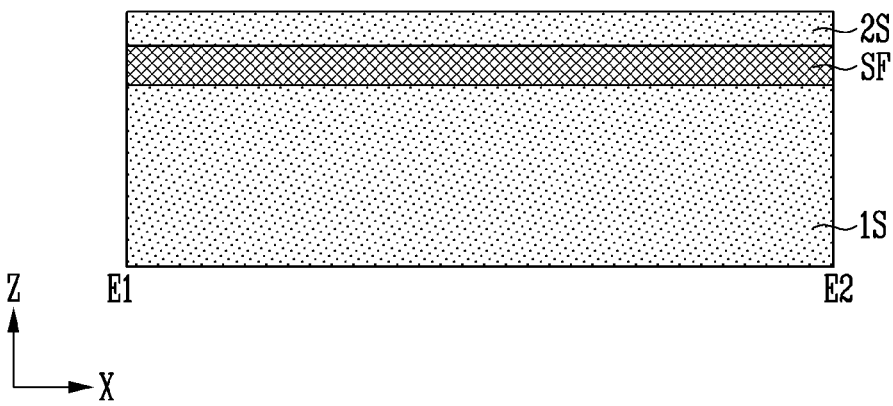
FIGS. 11A, 11B, 11C, 11D, 11E, 11F, 11G, 11H, 11I, and 11J are sectional views in an x-axis direction, illustrating a manufacturing method of a memory device in accordance with an embodiment of the present disclosure.
Figure 11B:
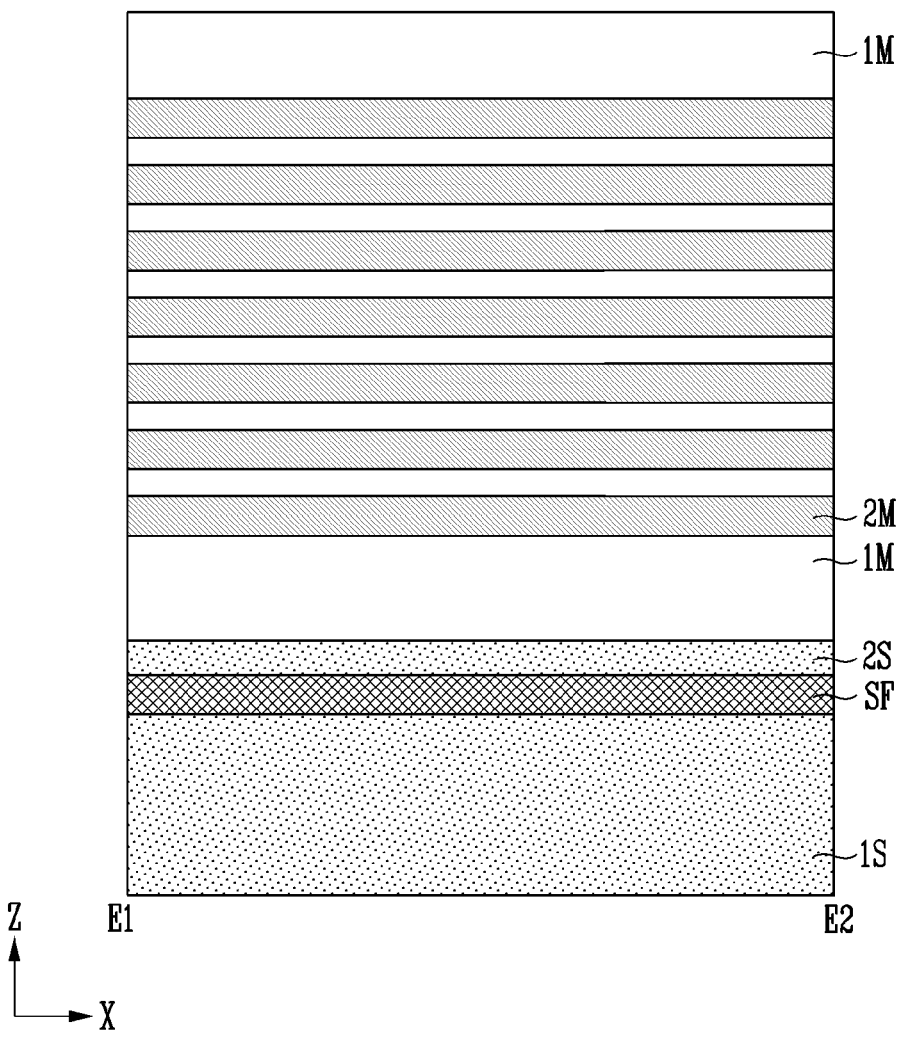

Referring to FIGS. 9A, 10A, and 11A, a first source layer 1S, a sacrificial layer SF, and a second source layer 2S may be stacked on a lower structure (not shown). The lower structure (not shown) may be a structure including a substrate or peripheral circuits. Since the first source layer 1S is a layer used as a source line, the first source layer 1S may be formed of a conductive material. The second source layer 2S may be formed of the same material as the first source layer 1S. For example, the first source layer 1S and the second source layer 2S may be formed of a conductive material such as poly-silicon, tungsten or nickel. The sacrificial layer SF may be formed of a material having an etch selectivity with respect to the first source layer 1S. In an embodiment, in order to protect the first and second source layers 1S and 2S in a subsequent process, a buffer layer may be further formed between the first source layer 1S and the sacrificial layer SF and between the second source layer 2S and the sacrificial layer SF. For example, the buffer layer may be formed of an oxide layer. Referring to FIGS. 9B, 10B, and 11B, first and second material layers 1M and 2M may be alternately stacked on the top of the second source layer 2S. For example, when a first material layer 1M is formed on the top of the second source layer 2S, a second material layer 2M may be formed on the top of the first material layer 1M, and a first material layer 1M may be again formed on the second material layer 2M. The first material layer 1M may be formed of an insulating material. For example, the first material layer 1M may be formed of an oxide layer or a silicon oxide layer. The second material layer 2M may be formed of a material which may be removed in a subsequent process. Therefore, the second material layer 2M may be formed of a material having an etch selectivity different from an etch selectivity of the first material layer 1M. For example, the second material layer 2M may be formed of a nitride layer. The first material layer 1M may be formed at a lowermost end and an uppermost end in a structure in which the first and second material layers 1M and 2M are stacked. Accordingly, a stack structure STK may be formed, in which the first and second material layers 1M and 2M are stacked.

Figure 9C:
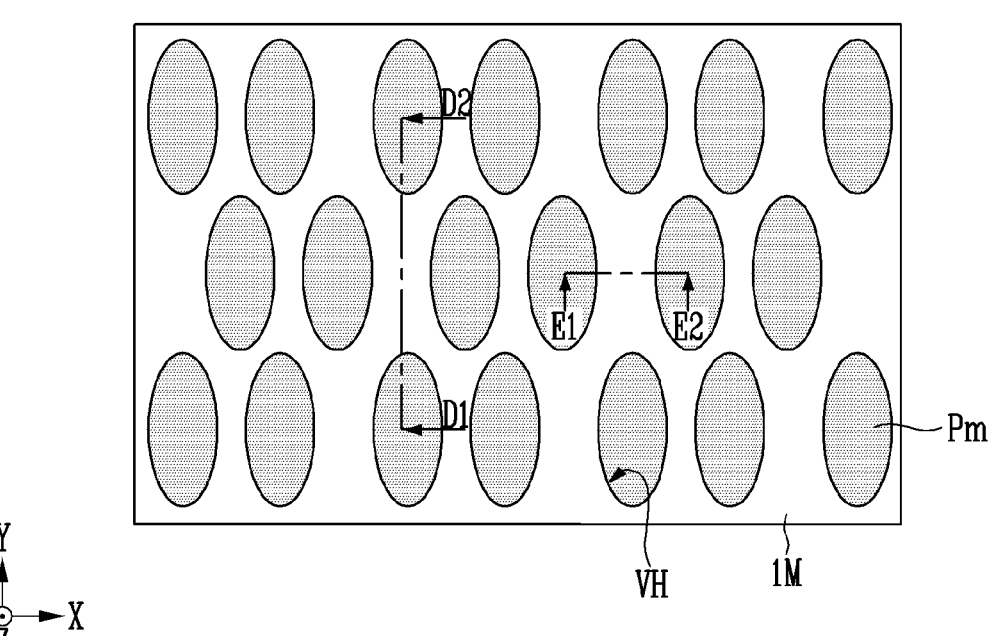
Figure 9C:
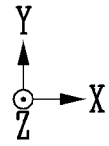
Figure 10C:
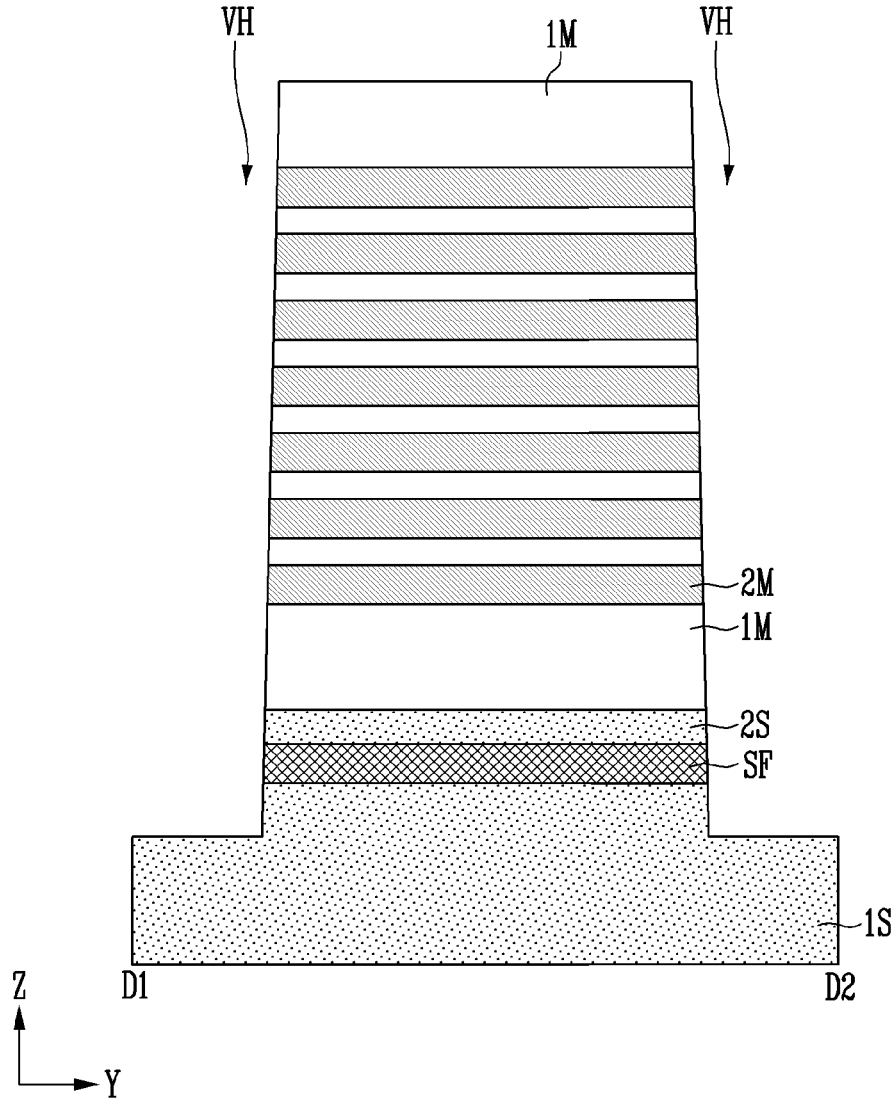
Figure 11C:
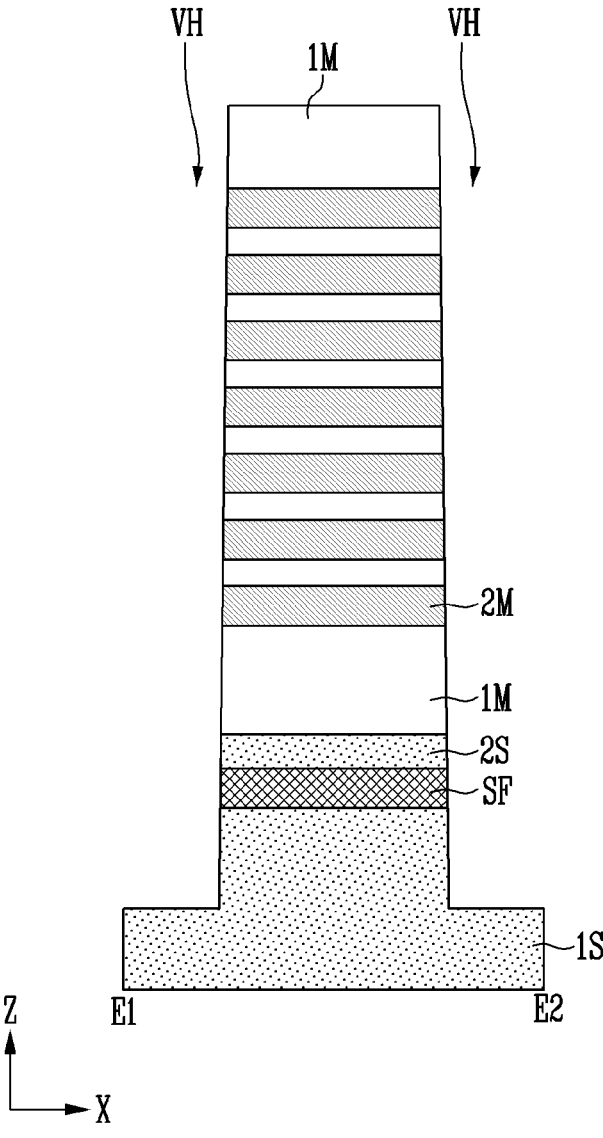

Referring to FIGS. 9C, 10C, and 11C, a vertical hole VH exposing the first source layer 1S may be formed in a cell region of a memory block. For example, an etching process for removing portions of the first and second materials layers 1M and 2M and portions of the second source layer 2S, the sacrificial layer SF, and the first source layer 1S may be performed. The etching process may be performed as a dry etching process such that the vertical hole VH is formed in a direction vertical to the substrate. The vertical hole VH may be formed in a region for forming a main plug. A major axis of the vertical hole VH becomes the Y-axis direction, and a minor axis of the vertical hole VH becomes the X-axis direction. When the etching process for forming the vertical hole VH is ended, the first source layer 1S may be exposed through a bottom surface of the vertical hole VH, and the first and second material layers 1M and 2M, the second source layer 2S, and the sacrificial layer SF may be exposed through a side surface of the vertical hole VH.

Figure 9D:
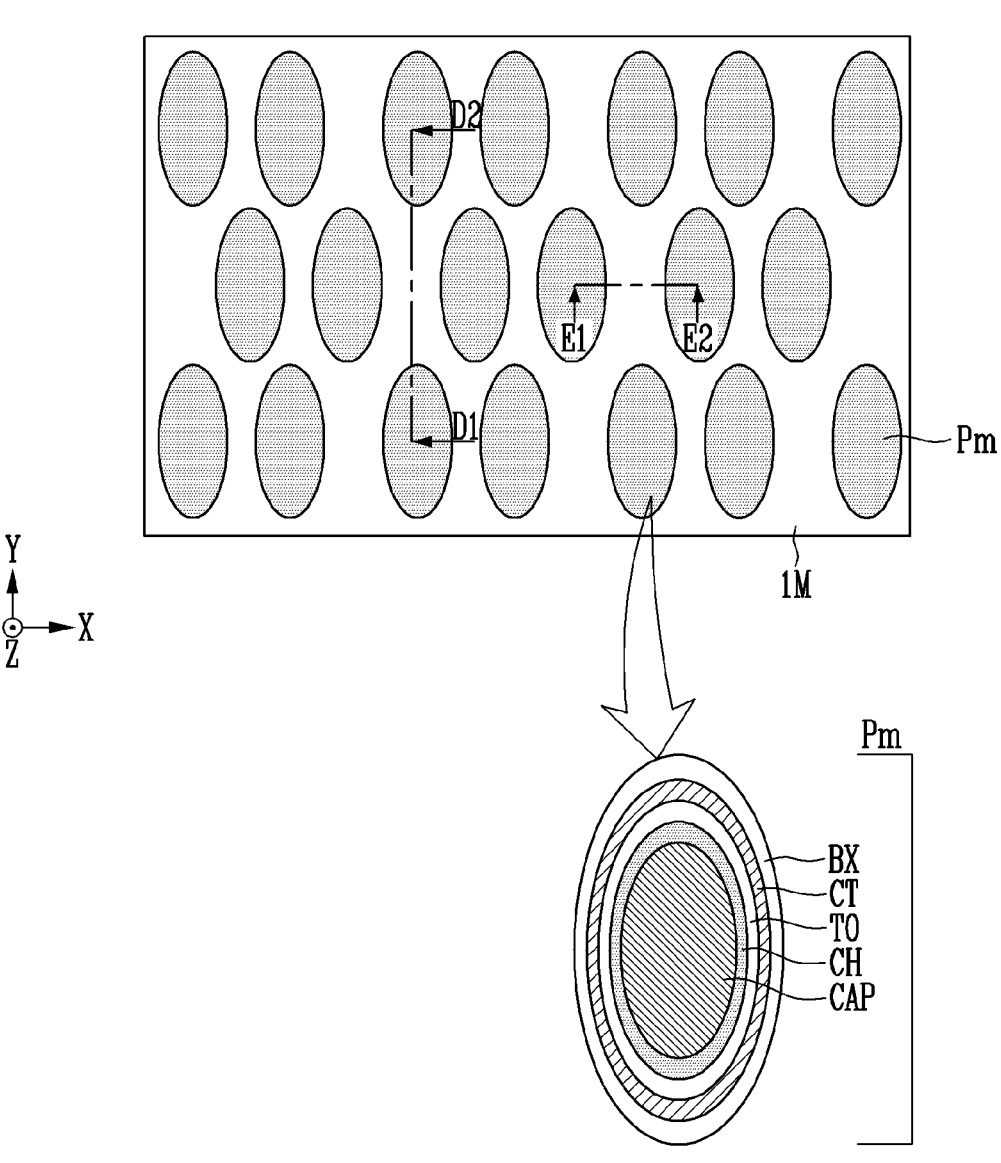
Figure 10D:
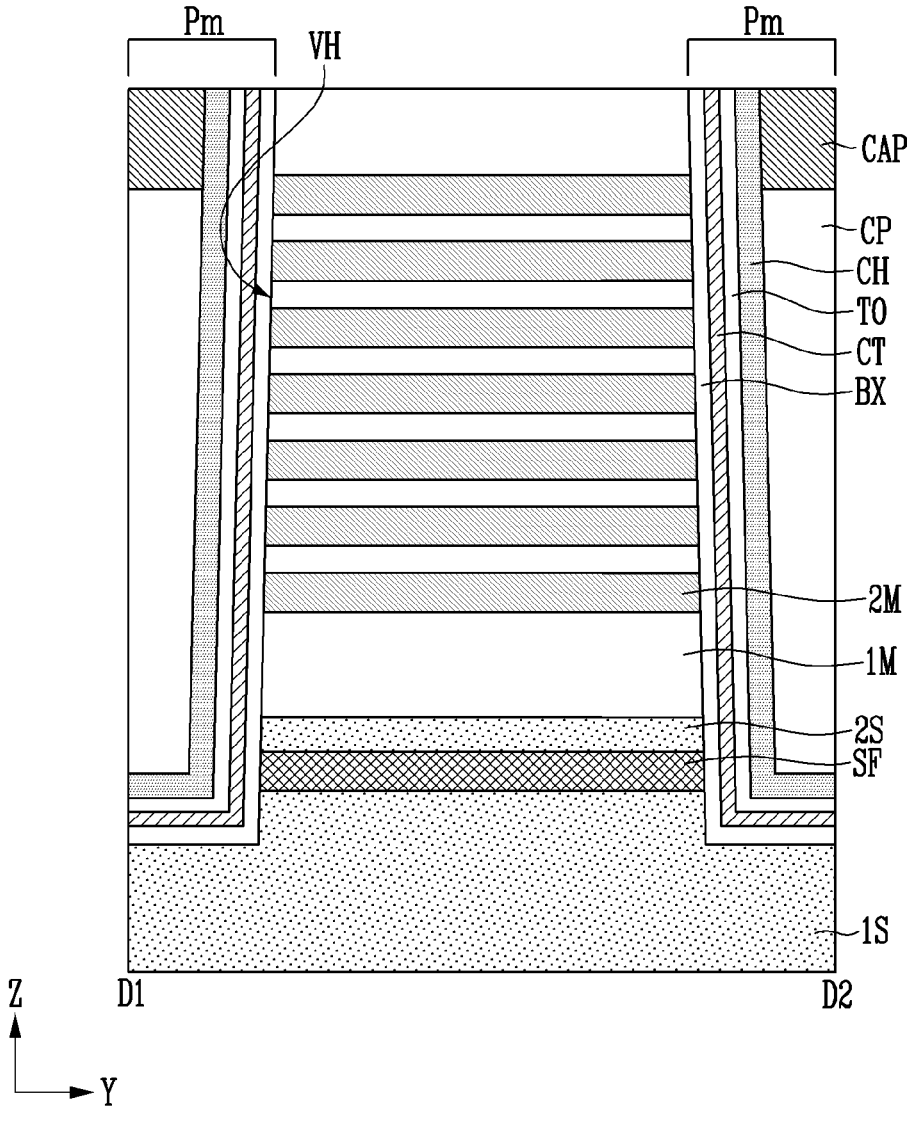
Figure 11D:
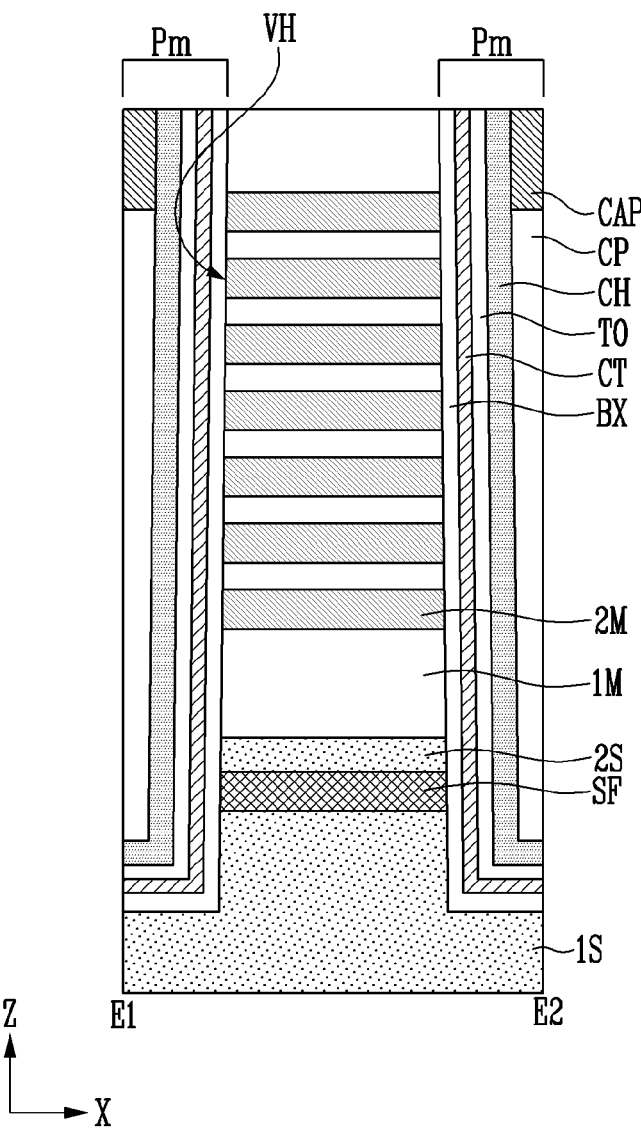

Referring to FIGS. 9D, 10D, and 11D, a main plug Pm may be formed inside the vertical hole VH. The main plug Pm may include a blocking layer BX, a charge trap layer CT, a tunnel insulating layer TO, a channel layer CH, a core pillar CP, and a capping layer CAP. For example, the blocking layer BX may be formed along an inner surface of the vertical hole VH formed in a cylindrical shape. The blocking layer BX may be formed in a cylindrical shape which does not entirely fill the inside of the vertical hole VH. Subsequently, the charge trap layer CT may be formed in a cylindrical shape along an inner surface of the blocking layer BX, and the tunnel insulating layer TO may be formed in a cylindrical shape along an inner surface of the charge trap layer CT. The channel layer CH may be formed in a cylindrical shape along an inner surface of the tunnel insulating layer TO, and the core pillar CP may fill the inside surrounded by the channel layer CH. After the core pillar CP is formed, an etching process for removing a portion of an upper region of the core pillar CP may be performed, and the capping layer CAP may be formed in a region in which the core pillar CP is removed.

Figure 9E:
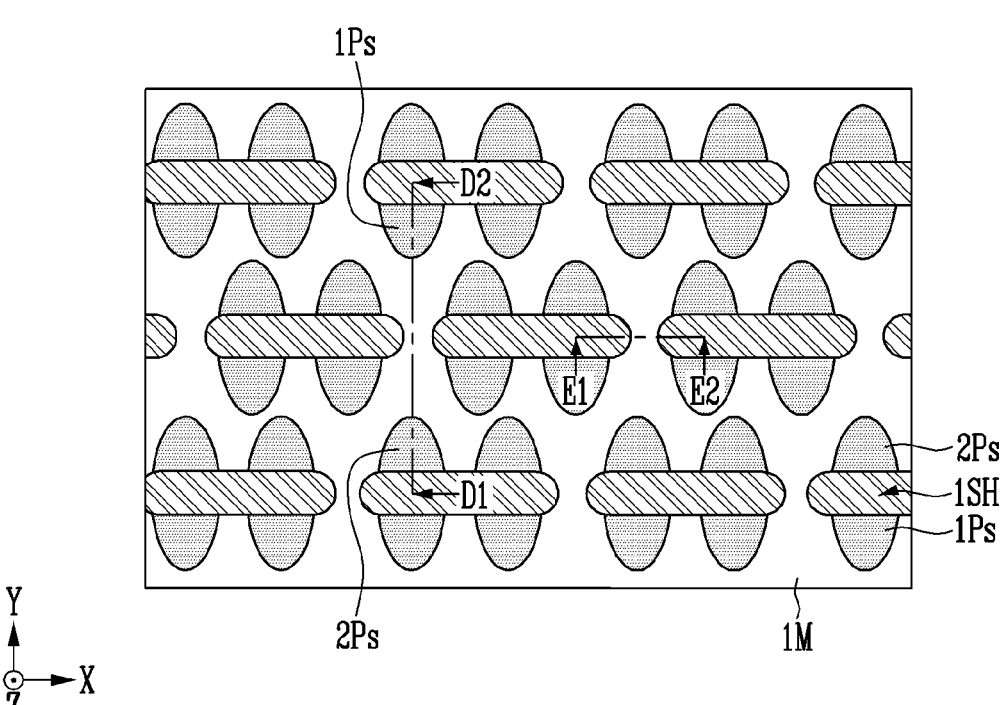
Figure 10E:
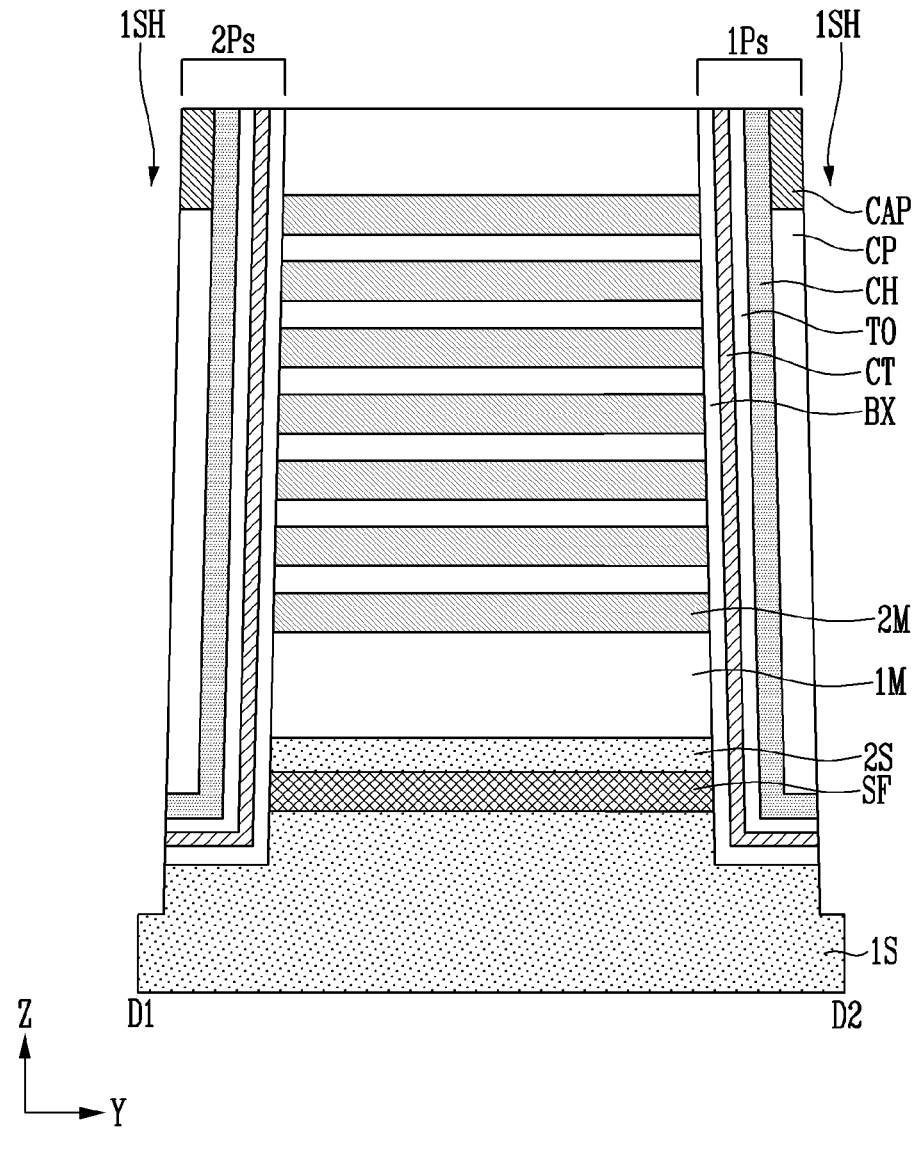
Figure 11E:
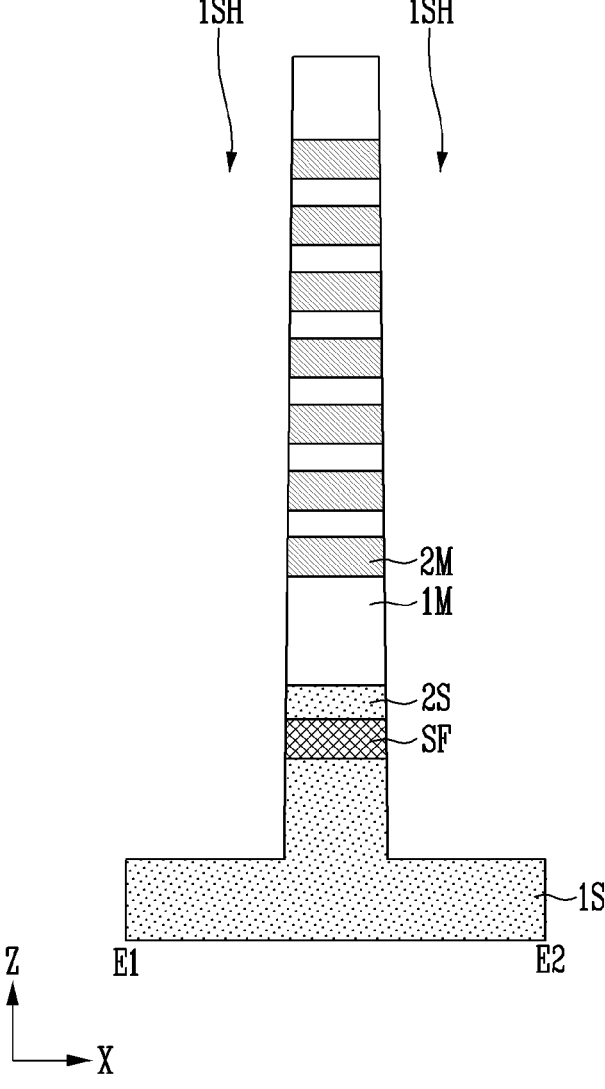

Referring to FIGS. 9E, 10E, and 11E, a first isolation hole 1SH may be formed, which isolates the main plug Pm in the Y-axis direction. The first isolation hole 1SH may be formed through an etching process of removing a portion of the main plug Pm. The etching process may be performed until the first source layer 1S of the cell region is exposed such that the channel layer CH included in the main plug Pm can be isolated. When the etching process for forming the first isolation hole 1SH is ended, the first source layer 1S may be exposed through a bottom surface of the first isolation hole 1SH, and the blocking layer BX, the charge trap layer CT, the tunnel insulating layer TO, the channel layer CH, the core pillar CP, and the capping layer CAP may be exposed through a side surface of the first isolation hole 1SH. The etching process may be performed as a dry etching process such that the first isolation hole 1SH is formed vertically to the substrate. The main plug Pm may be isolated into a first sub-plug 1Ps and a second sub-plug 2Ps by the first isolation hole 1SH.

Figure 9F:
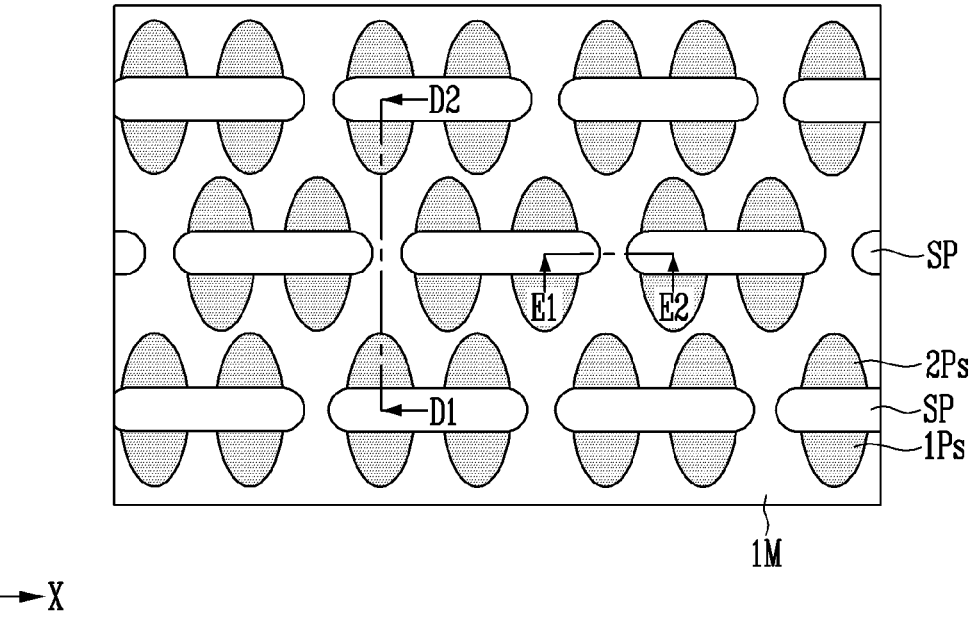
Figure 10F:
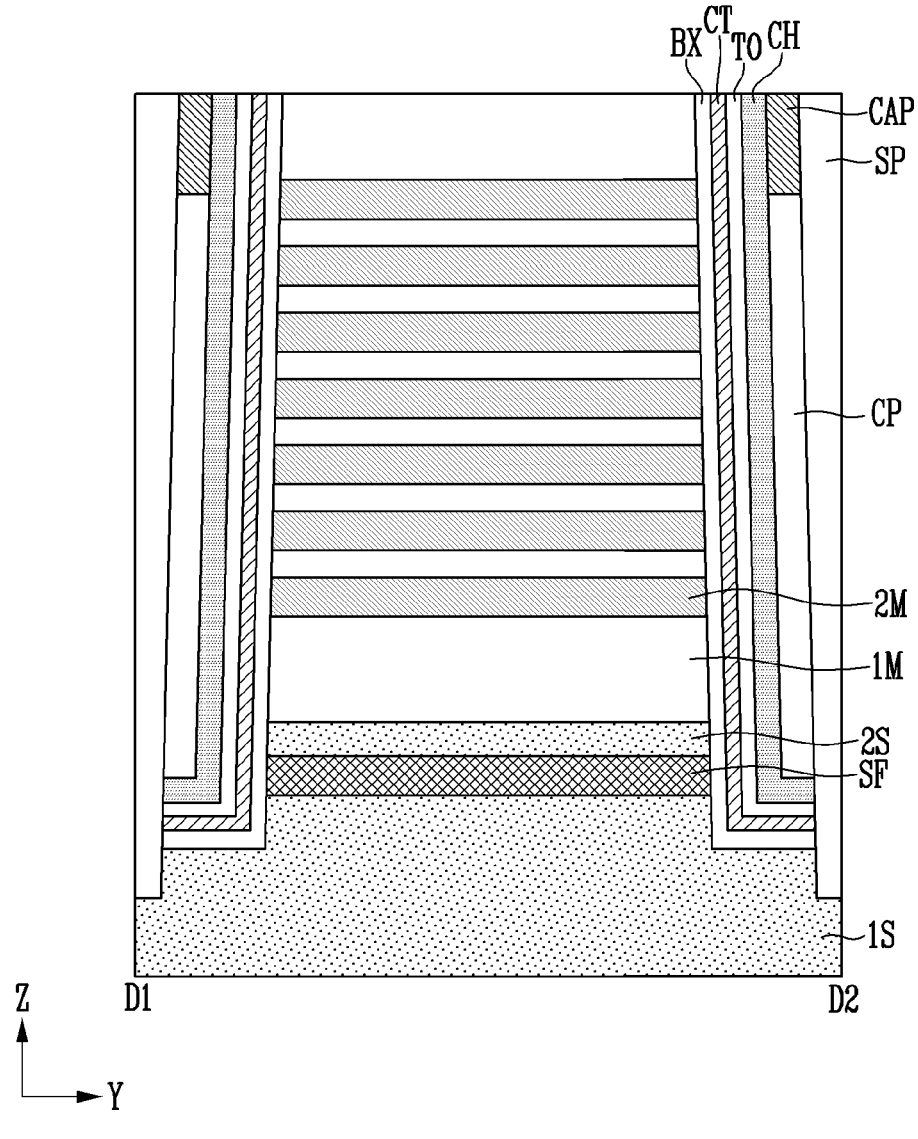
Figure 11F:
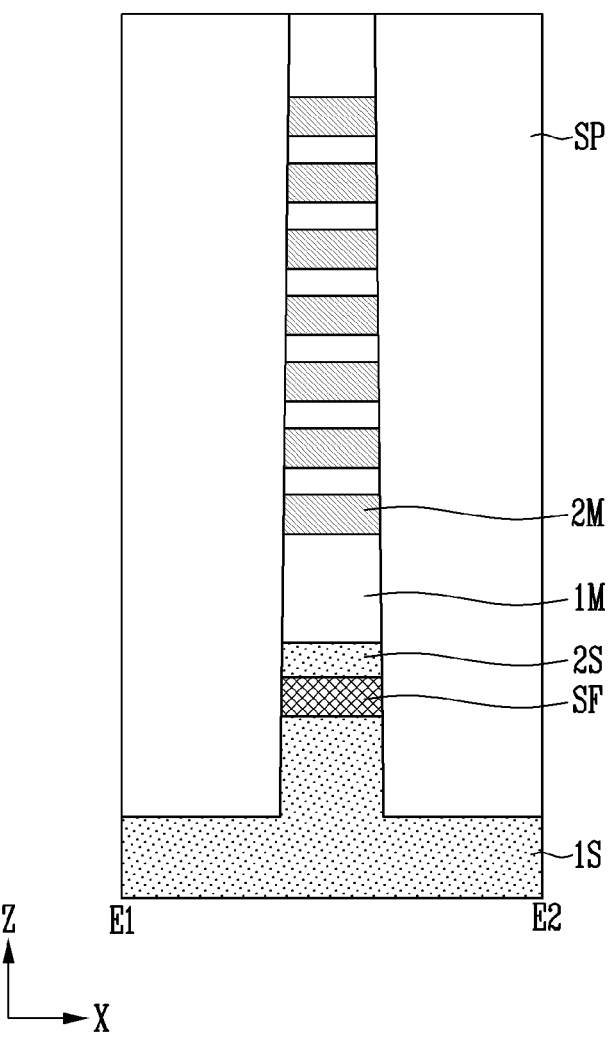

Referring to FIGS. 9F, 10F, and 11F, a plug isolation pattern SP may be formed inside the first isolation hole 1SH. The plug isolation pattern SP may be formed of an insulating material such that channel layers CH of the first and second sub-plugs 1Ps and 2Ps can be electrically blocked from each other. For example, the plugs isolation pattern SP may be formed of an oxide layer or a silicon oxide layer.

Figure 9G:
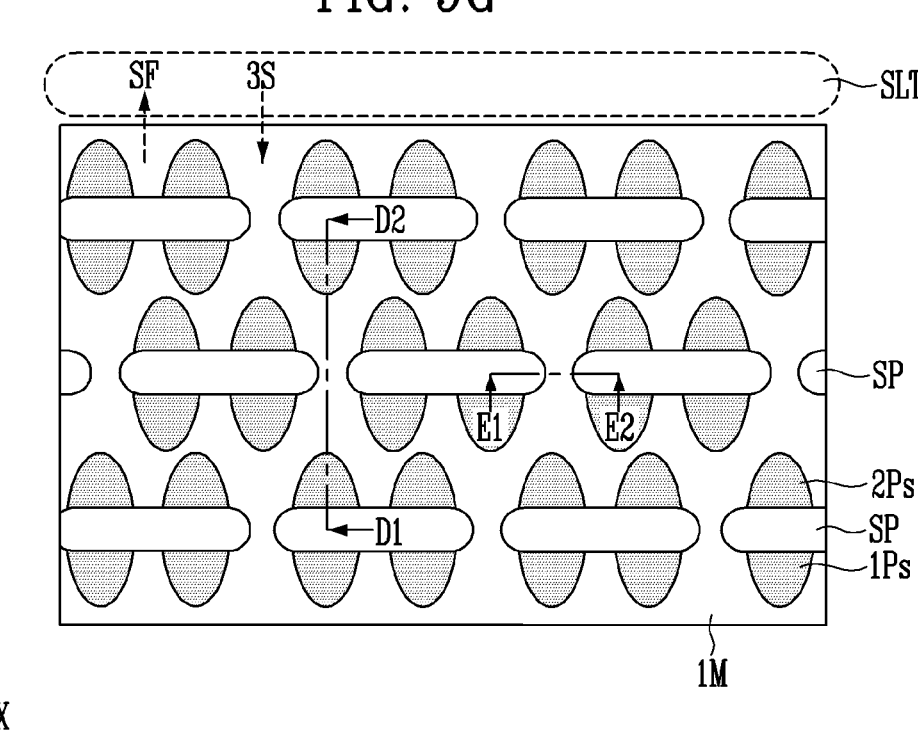
Figure 10G:
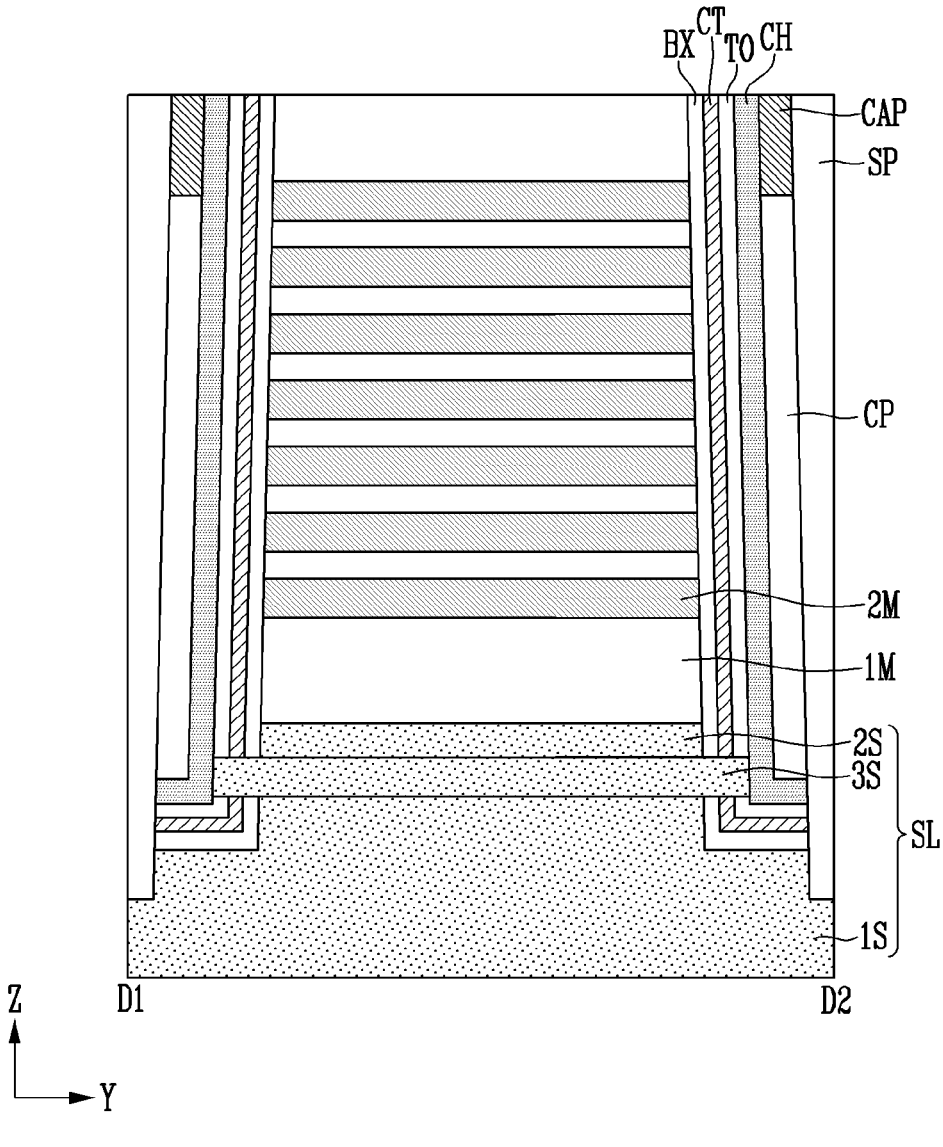
Figure 11G:
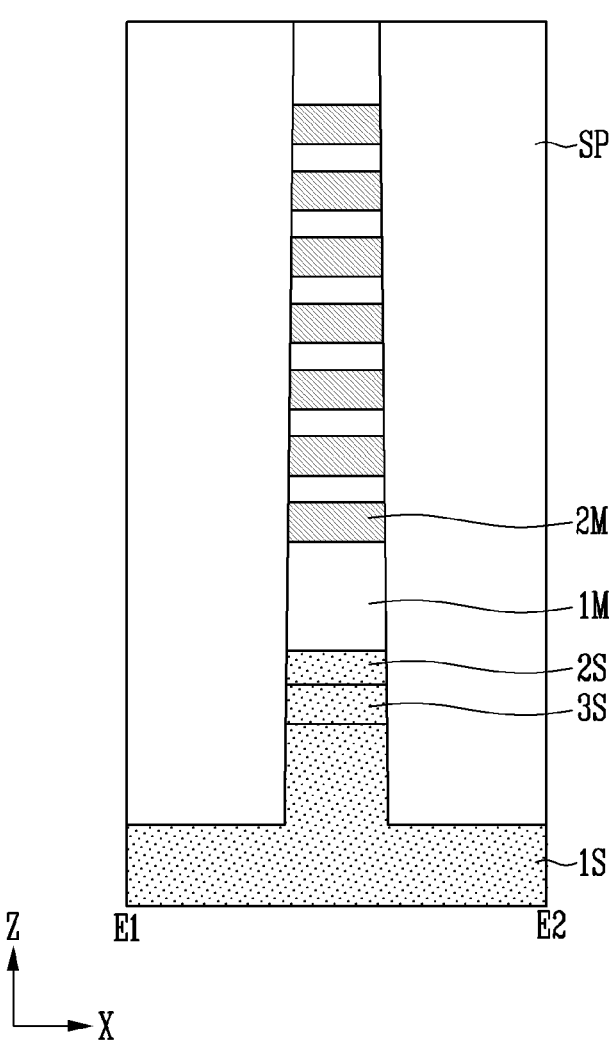

Referring to FIGS. 9G, 10G, and 11G, a trench-shaped slit SLT isolating memory blocks from each other may be formed by removing portions of the first and second material layers 1M and 2M. An etching process for forming the trench-shaped slit SLT may be performed until the first source layer 1S is exposed. An etching process for removing the sacrificial layer SF exposed through the trench-shaped slit SLT may be performed. When the sacrificial layer SF is removed, the blocking layer BX may be exposed between the first and second source layers 1S and 2S. When the blocking layer BX is exposed, an etching process for removing the blocking layer BX, the charge trap layer CT, and the tunnel insulating layer TO, which are exposed between the first and second source layers 1S and 2S, through the trench-shaped slit SLT may be performed. Subsequently, a third source layer 3S may be formed in a region in which the sacrificial layer SF, the blocking layer BX, the charge trap layer CT, and the tunnel insulating layer TO, which are exposed through the trench-shaped slit SLT, are removed. The third source layer 3S may be formed of the same material as the first or second source layer 1S or 2S. For example, the third source layer 3S may be formed of poly-silicon, tungsten, nickel or the like as a conductive material. Therefore, a source line SL configured with the first to third source layers 1S to 3S may be formed.

Figure 9H:
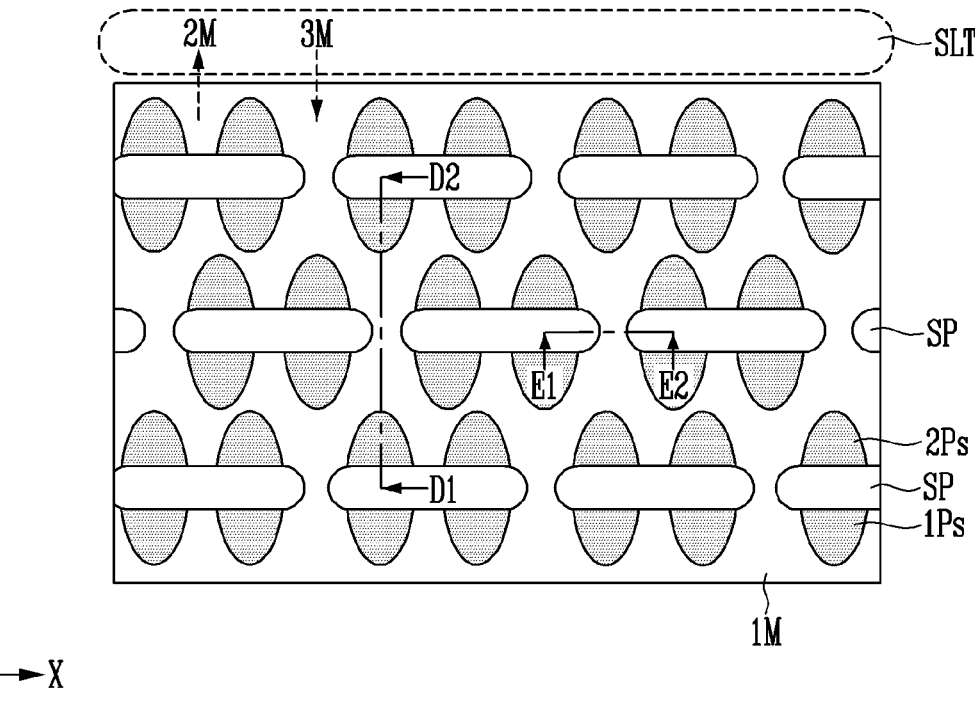
Figure 10H:
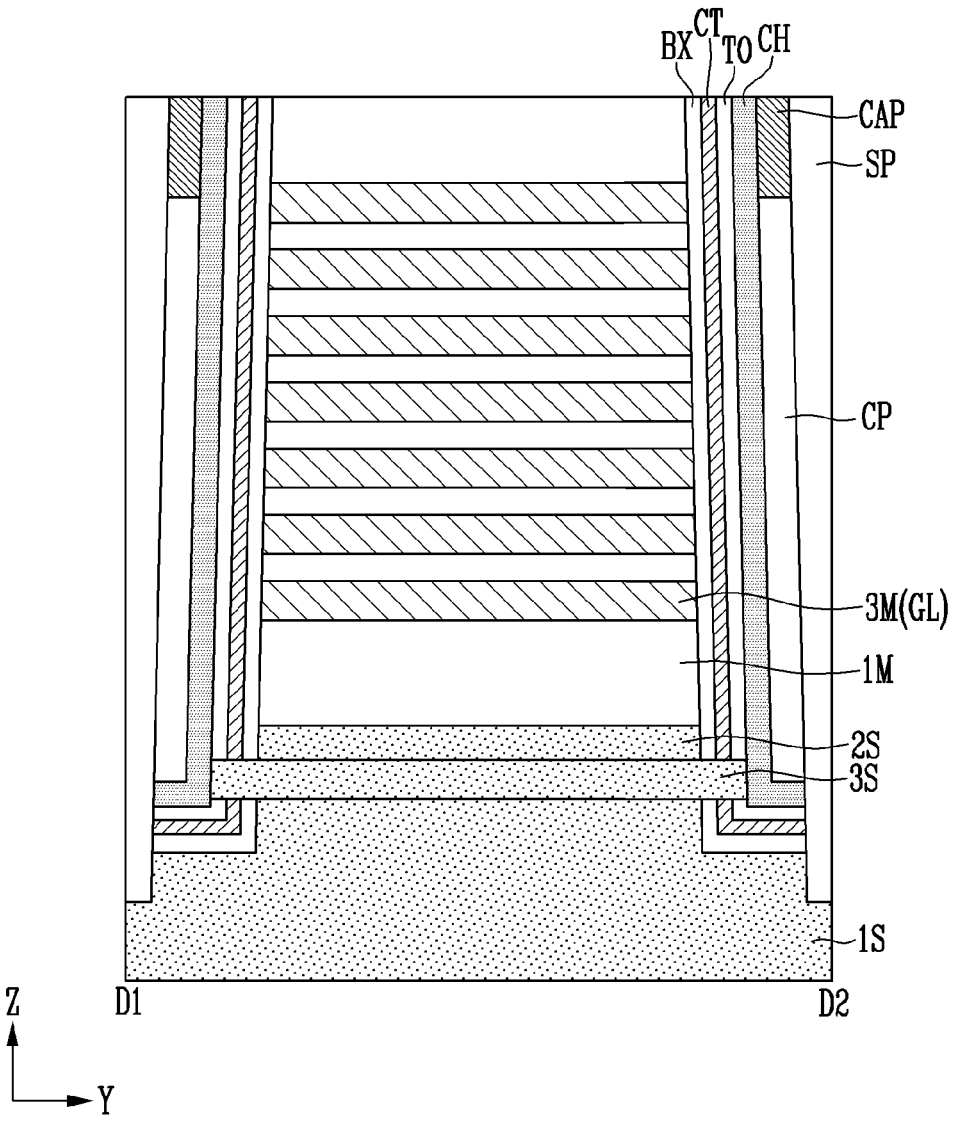
Figure 11H:
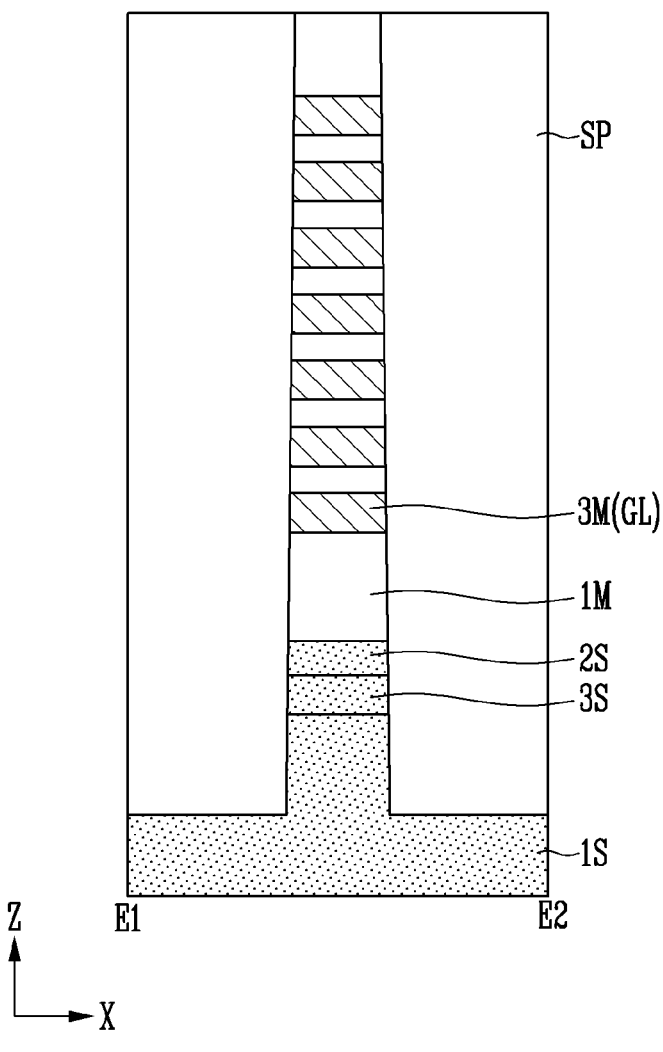

Referring to FIGS. 9H, 10H, and 11H, an etching process for removing the second material layer 2M through the trench-shaped slit SLT may be performed. The etching process may be performed as a wet etching process using an etchant for allowing the first material layer 1M to remain and selectively removing the second material layer 2M. A third material layer 3M may be formed in a region in which the second material layer 2M is removed. For example, the third material layer 3M may be formed between the first material layers 1M through the trench-shape slit SLT. Since the third material layer 3M is used as a gate line GL, the third material layer may be formed of a conductive material. For example, the third material layer 3M may be formed of tungsten (W), cobalt (Co), nickel (Ni), molybdenum (Mo), silicon (Si), poly-silicon (poly-Si), or the like.

Figure 9I:
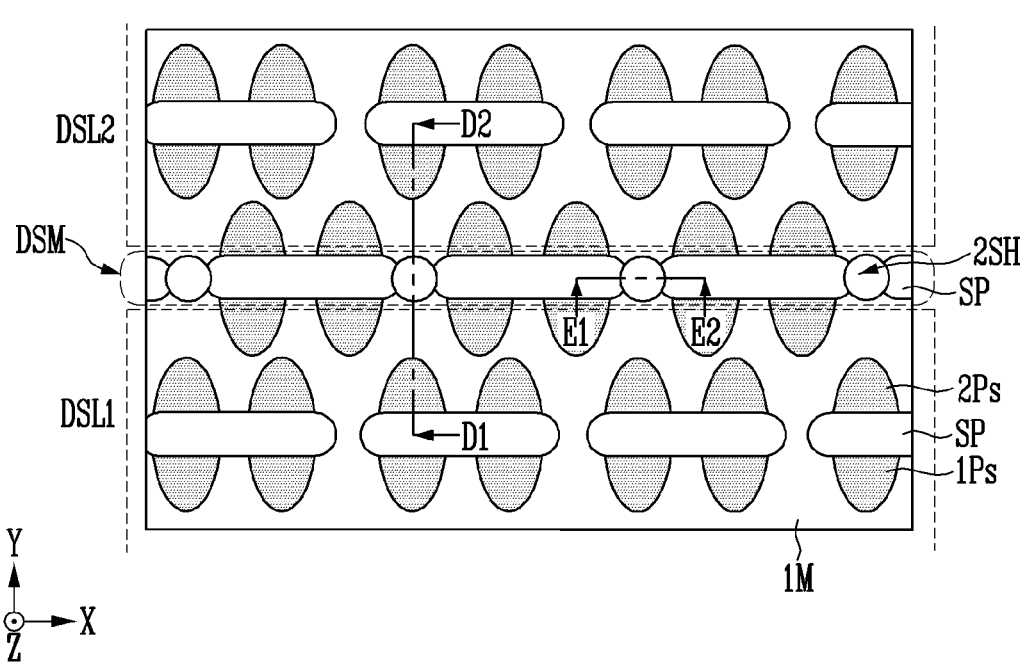
Figure 10I:
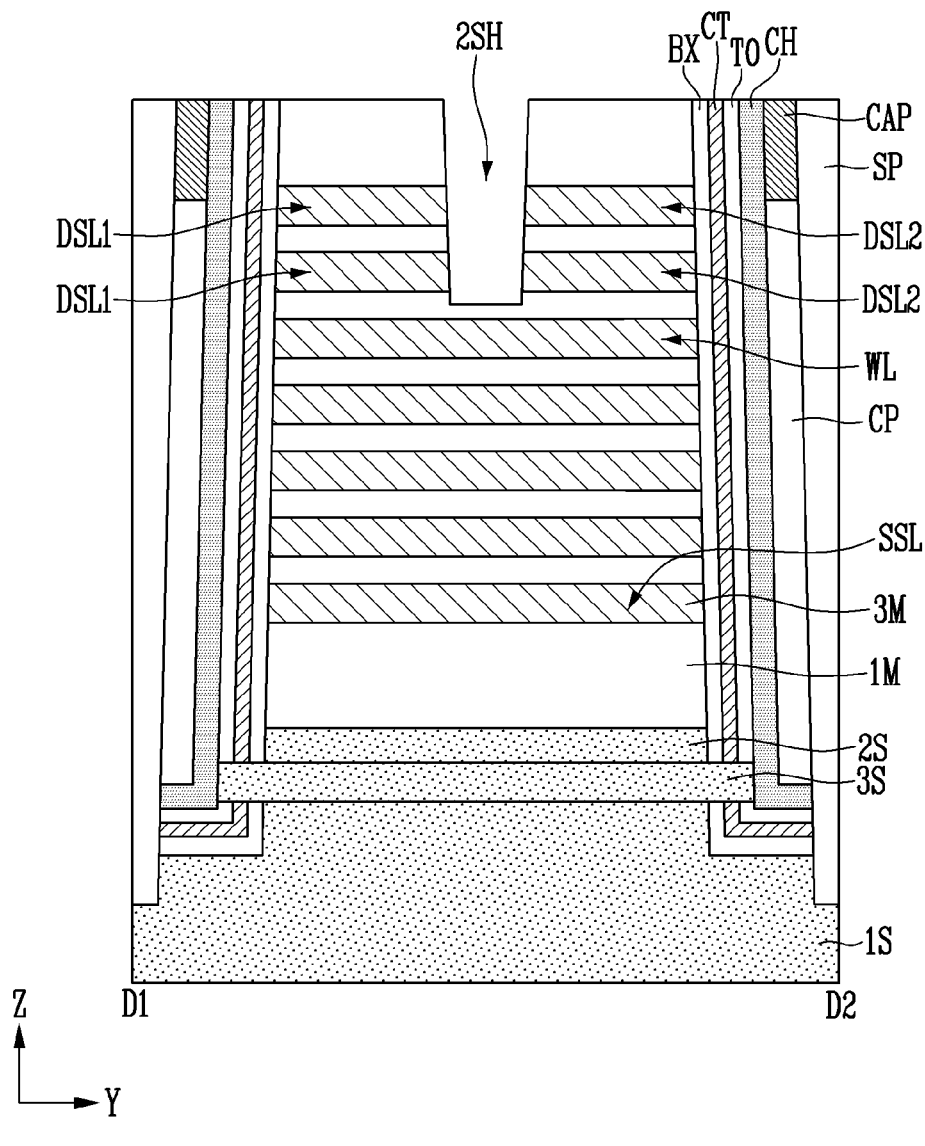
Figure 11I:
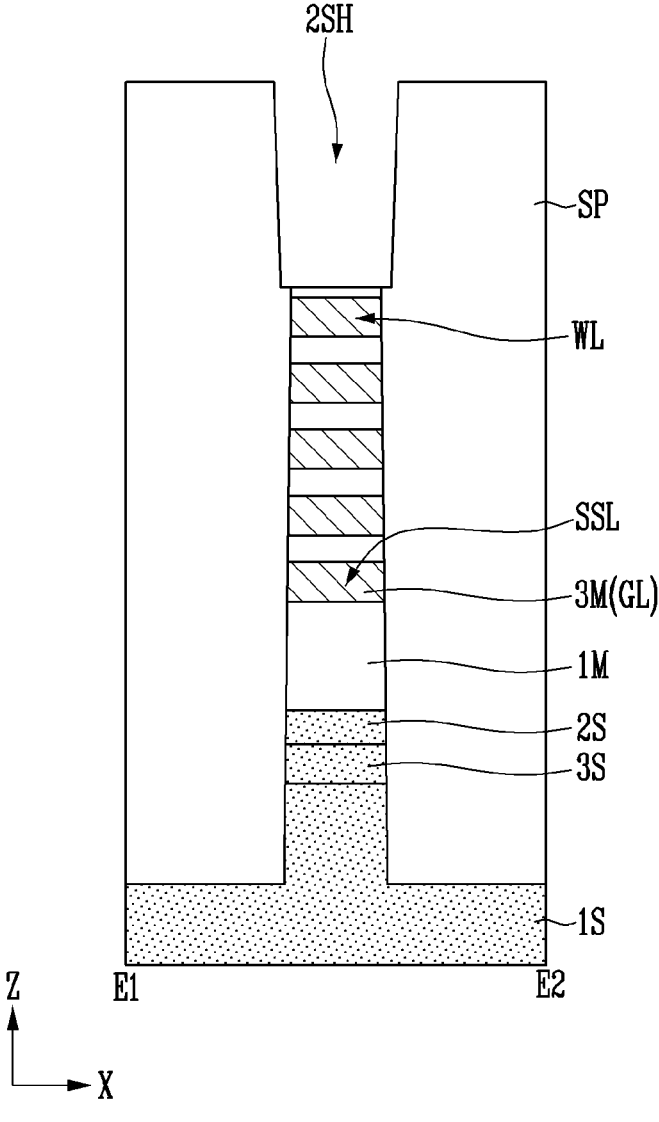

Referring to FIGS. 9I, 10I, and 11I, a second isolation hole 2SH may be formed to form a drain isolation mask DSM. The drain isolation mask DSM may be a structure for isolating drain select lines DSL1 and DSL2 from each other. For example, the drain isolation mask DSM isolates the drain select lines DSL1 and DSL2 into a first drain select line DSL1 and a second drain select line DSL2 in the Y-axis direction. An etching process for forming the second isolation hole 2SH may be performed until the first material layer 1M formed on the bottom of the drain select lines DSL1 and DSL2 is exposed such that gate lines GL for the drain select lines DSL1 and DSL2, which are formed in the same layer, can be isolated from each other. For example, when two lines formed at a top end among the gate lines GL are specified as the drain select lines DSL1 and DSL2, the second isolation hole 2SH may be formed such that the two lines specified as the drain select lines DSL1 and DSL2 are isolated from each other.

The etching process for forming the second isolation hole 2SH may be performed such that portions of the first and third material layers 1M and 3M and the plug isolation pattern SP are removed in the vertical direction. For example, the etching process for forming the second isolation hole 2SH may be performed as an anisotropic dry etching process. Therefore, portions of plug isolation patterns SP facing each other may be exposed through the second isolation hole 2SH.

Figure 9J:
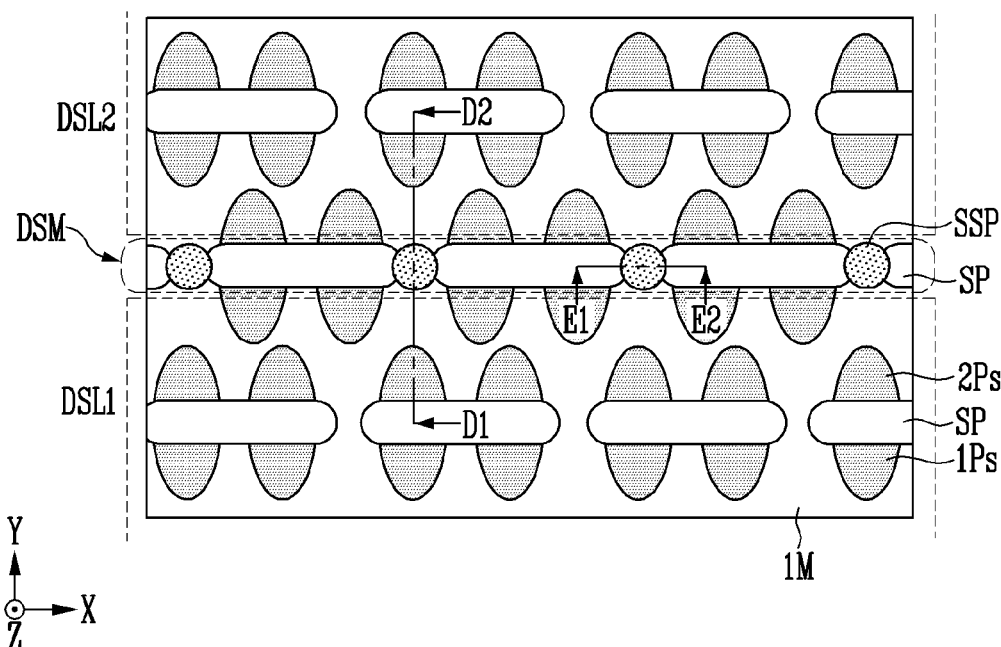
Figure 10J:
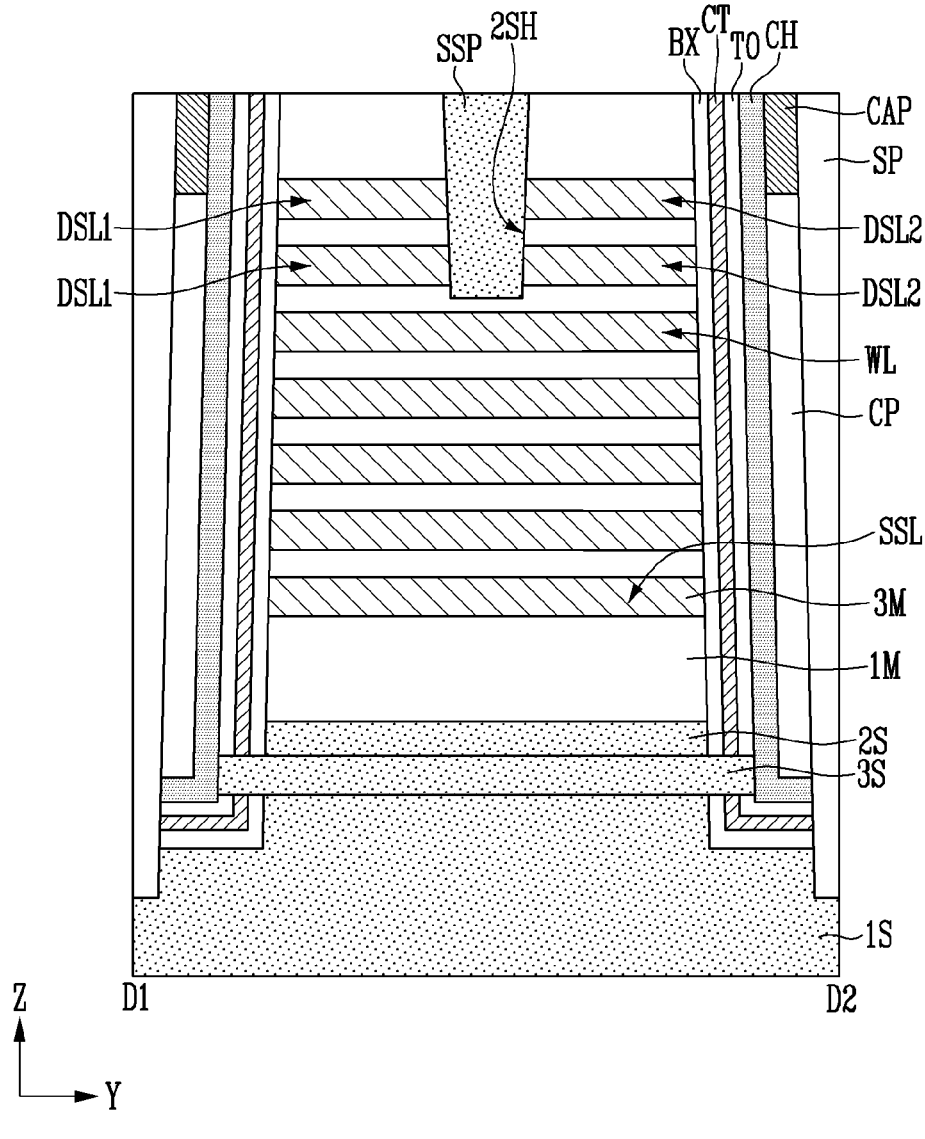
Figure 11J:
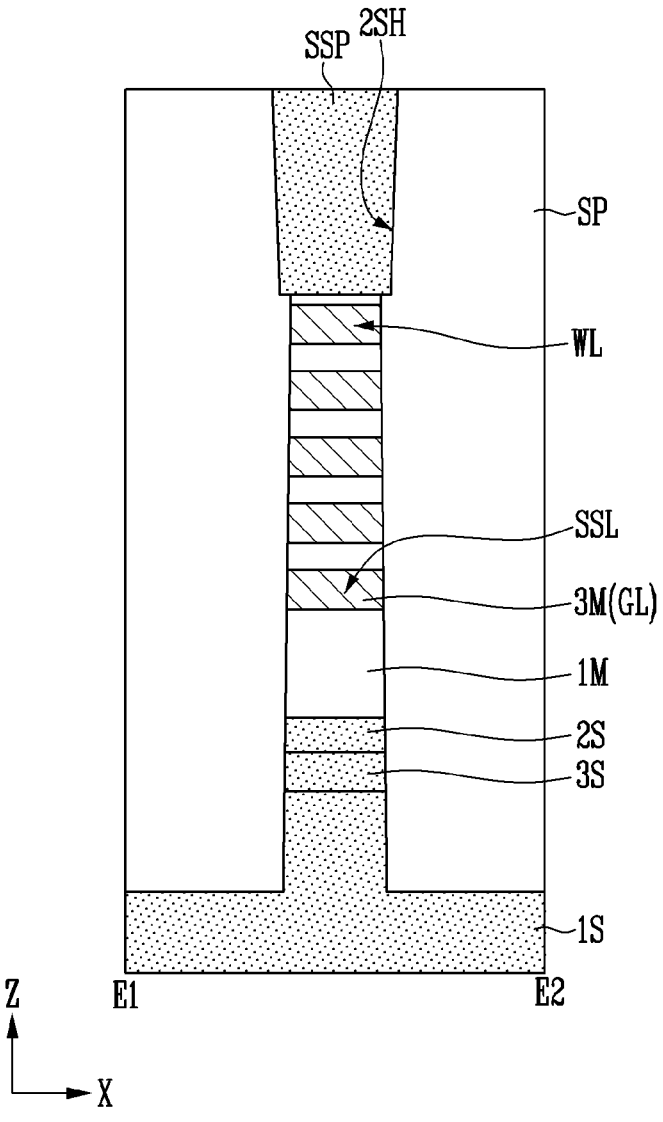

Referring to FIGS. 9J, 10J, and 11J, a select isolation pattern SSP may be formed inside the second isolation hole 2SH. Since the select isolation pattern SSP is to isolate some gate lines GL formed in the same layer in the Y-axis direction, the select isolation pattern SSP may be formed of an insulating material. For example, the select isolation pattern SSP may be formed of oxide or silicon oxide. The select isolation pattern SSP may be in contact with the first and third material layers 1M and 3M along the Y-axis direction, and be in contact with the plug isolation patterns SP along the X-axis direction.

Figure 12:
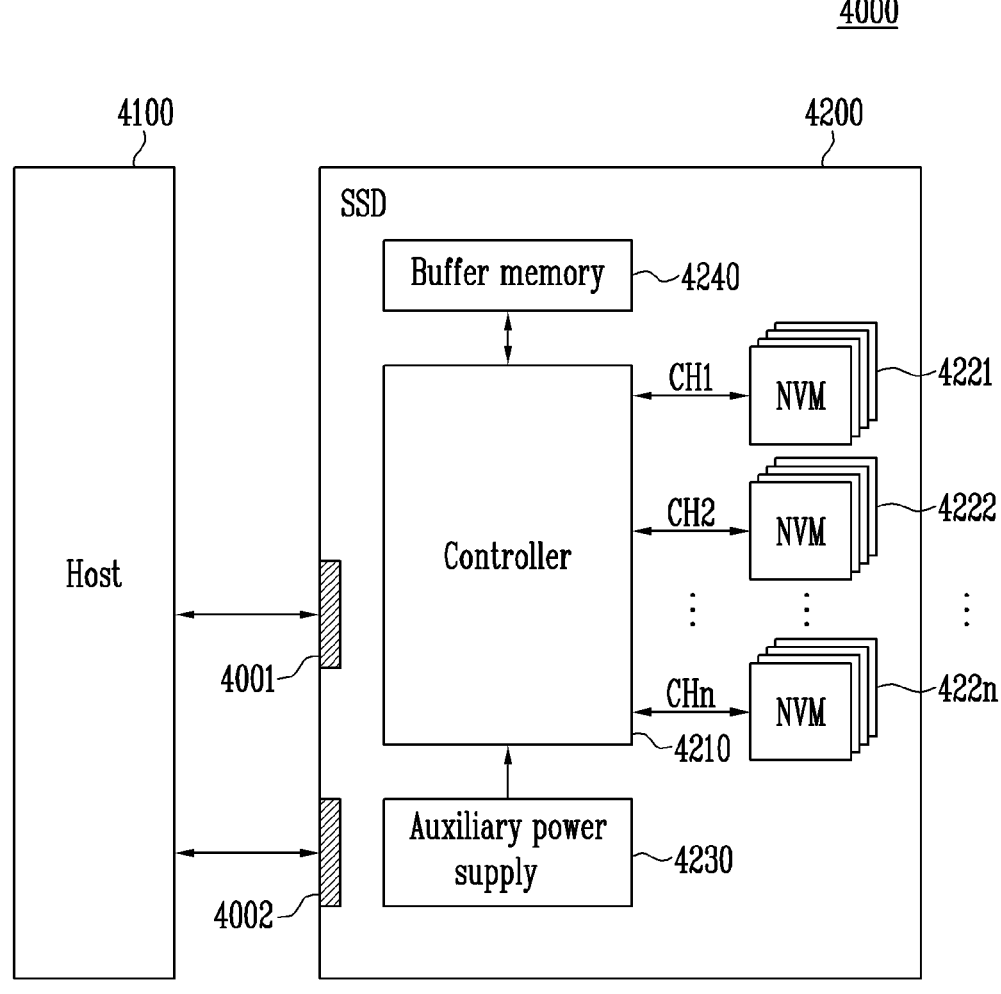
FIG. 12 is a diagram illustrating a Solid State Drive (SSD) system to which the memory device of the present disclosure is applied.

FIG. 12 is a diagram illustrating a Solid State Drive (SSD) system to which the memory device of the present disclosure is applied.

Referring to FIG. 12, the SSD system 4000 includes a host 4100 and an SSD 4200. The SSD 4200 may exchange a signal with the host 4100 through a signal connector 4001, and be supplied with power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. Exemplarily, the signal may be transmitted based on an interface between the host 4100 and the SSD 4200. For example, the signal may be defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. Each of the plurality of memory devices 4221 to 422n may be configured identically to the memory device 100 shown in FIG. 1. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may be used as a buffer memory of the SSD 4200. For example, the buffer memory 4240 may store data received from the host 4100 or data received from the plurality of memory devices 4221 to 422n, or store meta data (e.g., a mapping table) of the plurality of memory devices 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 13:
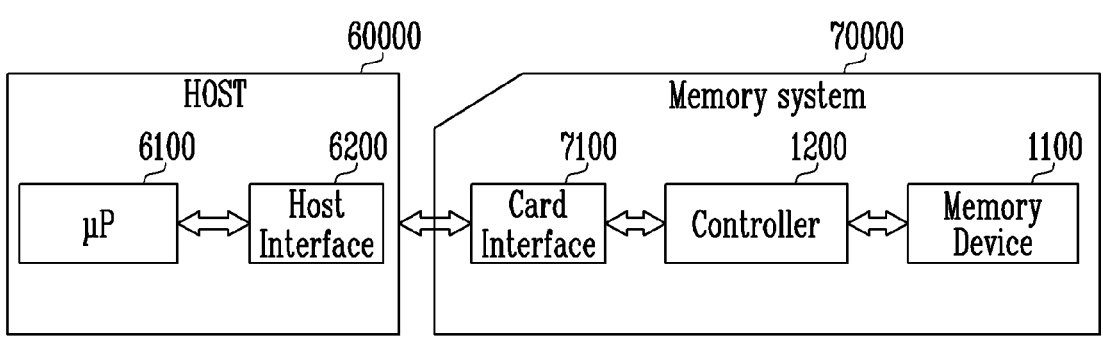
FIG. 13 is a diagram illustrating a memory card system to which the memory device of the present disclosure is applied.

FIG. 13 is a diagram illustrating a memory card system to which the memory device of the present disclosure is applied.

Referring to FIG. 13, the memory system 70000 may be implemented as a memory card or a smart card. The memory system 70000 may include a memory device 1100, a controller 1200, and a card interface 7100.

The memory device 1100 may be configured identically to the memory device 100 shown in FIG. 1.

The controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 1100 through the card interface 7100 and the controller 1200 under the control of a microprocessor (µP) 6100.

In accordance with the present disclosure, in an embodiment, the degree of integration of the memory device can be improved.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a stack structure including a plurality of gate lines stacked in a vertical direction over a source line, the plurality of gate lines spaced apart from each other in the vertical direction;
main plugs arranged to be spaced apart from each other in a direction parallel to the plurality of gate lines;
plug isolation patterns isolating the main plugs into first and second sub-plugs; and
a select isolation structure comprising a select isolation pattern together with the plug isolation pattern,
wherein the plurality of gate lines include at least one cell gate line and at least on select line,
wherein the select isolation pattern penetrates at least one select line, to divide the at least one select line into a first select line and a second select line formed in the same level, and
wherein the select isolation structure extends in a direction vertical to a direction in which the first sub-plug and the second sub-plug are arranged.

2. The memory device of claim 1, wherein the plug isolation patterns disposed between the first sub-plug and the second sub-plug.

3. The memory device of claim 2, wherein each of the first and second sub-plugs includes a core pillar, a channel layer, a tunnel insulating layer, a charge trap layer, and a blocking layer, which are formed in the vertical direction.

4. The memory device of claim 1, wherein the plug isolation patterns are formed of an insulating material.

5. The memory device of claim 1, wherein the plug isolation patterns penetrate the main plugs and the stack structure.

6. The memory device of claim 1, wherein the select isolation pattern along with the plug isolation patterns adjacent to each other isolates the at least one select line, from the plurality of gate lines, into a first drain select line and a second drain select line formed in the same level.

7. The memory device of claim 1, wherein the select isolation pattern penetrates at least a portion of the plug isolation patterns adjacent to each other.

8. The memory device of claim 1, wherein the select isolation pattern is formed in one of a circular or an elliptical shape partially overlapping with the plug isolation patterns adjacent to each other.

9. The memory device of claim 1, wherein the select isolation pattern is formed of an insulating material.

10. The memory device of claim 1, wherein the stack structure is isolated by the select isolation pattern and the plug isolation patterns.

11. The memory device of claim 1, wherein the select isolation pattern contacts with the plug isolation patterns adjacent to each other.

12. The memory device of claim 1, wherein the gate lines include source select lines, word lines and drain select lines which are stacked to be spaced apart from each other, and
wherein the drain select lines are isolated by the select isolation pattern and the plug isolation patterns into the first and second drain select lines.

13. The memory device of claim 1, wherein the select isolation structure isolates the plurality of gate lines by cooperation between the select isolation pattern and the plug isolation patterns.

14. The memory device of claim 1, wherein each of the plug isolation patterns fully penetrates the main plugs in the vertical direction.

* * * * *